US012628708B2

(12) United States Patent
Lee et al.

(10) Patent No.: US 12,628,708 B2
(45) Date of Patent: May 12, 2026

(54) SEMICONDUCTOR PACKAGE AND METHOD OF MANUFACTURING THE SAME

(71) Applicant: Samsung Electronics Co., Ltd., Suwon-si (KR)

(72) Inventors: Jeongho Lee, Suwon-si (KR); Doohwan Lee, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 677 days.

(21) Appl. No.: 17/752,083

(22) Filed: May 24, 2022

(65) Prior Publication Data

US 2023/0060618 A1     Mar. 2, 2023

(30) Foreign Application Priority Data

Sep. 1, 2021     (KR) ........................ 10-2021-0116427

(51) Int. Cl.
*H10W 90/00*     (2026.01)
*H10W 70/05*     (2026.01)
*H10W 70/65*     (2026.01)

(52) U.S. Cl.
CPC ....... *H10W 90/701* (2026.01); *H10W 70/095* (2026.01); *H10W 70/65* (2026.01);
(Continued)

(58) Field of Classification Search
CPC .......................... H01L 23/49816; H01L 24/16
(Continued)

(56) References Cited

U.S. PATENT DOCUMENTS 5,251,806 A * 10/1993 Agarwala ............... H01L 24/12
                                                    257/E21.511
5,468,995 A * 11/1995 Higgins, III .......... H01L 21/563
                                                    257/E23.125
(Continued)

FOREIGN PATENT DOCUMENTS

JP           6105316 B2     3/2017
KR    10-2018-0084081 A     7/2018
KR    10-2020-0058129 A     5/2020

OTHER PUBLICATIONS

Office Action issued on Jul. 24, 2025 in Korean Application No. 10-2021-0116427.

*Primary Examiner* — Trang Q Tran
(74) *Attorney, Agent, or Firm* — Harness, Dickey & Pierce, P.L.C.

(57) ABSTRACT
A semiconductor package includes a redistribution portion including an insulating layer, a redistribution layer, and a redistribution via, an under-bump metallurgy (UBM) layer below the redistribution portion and including a UBM pad on a lower surface of the redistribution portion and a UBM via on the UBM pad to penetrate through the insulating layer, a semiconductor chip on an upper surface of the redistribution portion and electrically connected to the redistribution layer, an adhesive layer between the UBM layer and the insulating layer and including a conductive material, and a connection bump below the UBM pad and connected to the UBM layer. The UBM pad has a first diameter, and the UBM via has a second diameter, less than the first diameter, and an upper surface of the UBM pad is located on the same level as, or a level lower than, a lower surface of the insulating layer.

20 Claims, 17 Drawing Sheets

A

(52) U.S. Cl.
CPC .......... *H10W 70/093* (2026.01); *H10W 90/00* (2026.01); *H10W 90/722* (2026.01); *H10W 90/724* (2026.01)

(58) Field of Classification Search
USPC ........................................................ 257/738
See application file for complete search history.

(56) References Cited

U.S. PATENT DOCUMENTS

| | | | | |
|---|---|---|---|---|
| 5,508,561 | A * | 4/1996 | Tago ........................ H01L 24/13 | |
| | | | | 257/E21.511 |
| 6,451,682 | B1 * | 9/2002 | Fujikawa .......... H01L 21/76864 | |
| | | | | 438/618 |
| 8,658,467 | B2 | 2/2014 | Park et al. | |
| 9,818,734 | B2 | 11/2017 | Lin et al. | |
| 9,911,718 | B2 | 3/2018 | Prabhu et al. | |
| 10,522,438 | B2 | 12/2019 | Cheng et al. | |
| 10,903,151 | B2 | 1/2021 | Lu | |
| 2010/0224983 | A1 | 9/2010 | Huang et al. | |
| 2014/0091455 | A1 * | 4/2014 | Strothmann .......... H01L 21/568 | |
| | | | | 257/734 |
| 2015/0137352 | A1 * | 5/2015 | Chen ........................ H01L 24/11 | |
| | | | | 257/737 |
| 2015/0147226 | A1 * | 5/2015 | Yoshinari .............. C22C 19/057 | |
| | | | | 420/448 |
| 2015/0325497 | A1 | 11/2015 | Yu et al. | |
| 2015/0325520 | A1 | 11/2015 | Yu et al. | |
| 2016/0300813 | A1 | 10/2016 | Zhai et al. | |
| 2017/0005027 | A1 | 1/2017 | Yu et al. | |
| 2017/0110440 | A1 * | 4/2017 | Jang ........................ H01L 24/19 | |
| 2017/0365579 | A1 | 12/2017 | Yu et al. | |
| 2018/0358298 | A1 | 12/2018 | Zhai et al. | |
| 2018/0366535 | A1 | 12/2018 | Chong et al. | |
| 2019/0139933 | A1 | 5/2019 | Yu et al. | |
| 2019/0172818 | A1 * | 6/2019 | Lin ..................... H01L 25/0657 | |
| 2019/0326221 | A1 | 10/2019 | Bhagavat et al. | |
| 2020/0168549 | A1 | 5/2020 | Bhagavat et al. | |
| 2020/0203265 | A1 * | 6/2020 | Jung ................. H01L 23/49816 | |

* cited by examiner

A

150

G1

Z

X

Y

112

G2

Z

X

Y

100i

B

SEMICONDUCTOR PACKAGE AND METHOD OF MANUFACTURING THE SAME

CROSS-REFERENCE TO RELATED APPLICATION(S)

This application claims the benefit under 35 USC 119 (a) of Korean Patent Application No. 10-2021-0116427 filed on Sep. 1, 2021 in the Korean Intellectual Property Office, the entire disclosure of which is incorporated herein by reference for all purposes.

BACKGROUND

The present inventive concepts relate to a semiconductor package and a method of manufacturing the same.

Semiconductor packages may be mounted on substrates, such as mainboards, through various types of connection bumps. For a stable electrical connection between a semiconductor package and a substrate, an under-bump metallurgy (UBM) layer is disposed between a redistribution layer of a semiconductor package and a connection bump.

SUMMARY

Example embodiments provide a semiconductor package having improved reliability and mass productivity and a method of manufacturing the same.

According to some example embodiments, a semiconductor package includes a redistribution portion including an insulating layer, a redistribution layer on the insulating layer, and a redistribution via connected to the redistribution layer; an under-bump metallurgy (UBM) layer, the UBM layer including a UBM pad on a lower surface of the redistribution portion and a UBM via on the UBM pad, the UBM via penetrating the insulating layer; a semiconductor chip on an upper surface of the redistribution portion and electrically connected to the redistribution layer; an adhesive layer between the UBM layer and the insulating layer, the adhesive layer including a conductive material; and a connection bump below the UBM pad and connected to the UBM layer. The UBM pad has a first diameter, and the UBM via has a second diameter, less than the first diameter, and an upper surface of the UBM pad is at a same level as, or at a level lower than, a lower surface of the insulating layer.

According to some example embodiments, a semiconductor package includes a redistribution portion including an insulating layer, a redistribution layer on the insulating layer, and a redistribution via connected to the redistribution layer; an under-bump metallurgy (UBM) layer below a lower surface of the redistribution portion and connected to the redistribution via; a semiconductor chip on an upper surface of the redistribution portion and electrically connected to the redistribution layer; an adhesive layer on the lower surface of the redistribution portion and between the redistribution portion and the UBM layer; and a connection bump below the UBM layer and connected to the UBM layer. A crystal structure of the UBM layer and a crystal structure of the redistribution layer are different.

According to some example embodiments, a semiconductor package includes a redistribution portion including an insulating layer and a redistribution structure on the insulating layer; an under-bump metallurgy (UBM) layer below the redistribution portion, the UBM layer including a UBM pad below a lower surface of the redistribution portion and a UBM via in the insulating layer, on the UBM pad, and connecting the redistribution structure and the UBM pad; a semiconductor chip on an upper surface of the redistribution portion and electrically connected to the redistribution structure; and a connection bump below the UBM pad and connected to the UBM pad. When viewed in cross-section, an upper end of the UBM pad has a first width and a lower end of the UBM pad has a second width less than the first width and an upper end of the UBM via has a third width and a lower end of the UBM via has a fourth width greater than the third width.

According to example embodiments, a method of manufacturing a semiconductor package includes forming a first mask layer on an upper surface of a carrier substrate including a copper foil layer; using the first mask layer to pattern the metal foil layer such that at least of a portion of a first surface of the metal foil layer is removed by a first thickness; forming a redistribution portion on the metal foil layer, the redistribution portion including an insulating layer and a redistribution structure; mounting a semiconductor chip on the redistribution portion; sealing the semiconductor chip with an encapsulation layer; removing a region of the carrier substrate such that the metal foil layer remains on the redistribution portion; using the second mask layer to pattern the metal foil layer such that at least a portion of the second surface of the metal foil layer is removed by a second thickness and at least a portion of the insulating layer is exposed. An under-bump metallurgy (UBM) layer including a UBM via having the first thickness and a UBM pad having the second thickness is formed by the copper foil layer that remains.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, some example embodiments will be described with reference to the accompanying drawings.

Unless otherwise specified, in this specification, spatially relative terms such as 'plan view,' 'upper', 'upper surface', 'lower', 'lower surface', 'side,' 'side surface' and/or the like are based on the drawings, and in fact, depending on the direction in which the element is disposed, the terms may be modified. For example, the device may also be oriented in other ways (for example, turned over, and/or rotated 90 degrees and/or at other orientations), and the spatially relative terms used herein are to be interpreted accordingly.

When the terms "about" or "substantially" are used in this specification in connection with a numerical value, it is intended that the associated numerical value includes a manufacturing and/or operational tolerance (e.g., ±10%) around the numerical value. Moreover, when the words "about" and "substantially" are used in connection with geometric shapes, it is intended that precision of the geometric shape is not required but that latitude for the shape is within the scope of the disclosure. Thus, while terms like "same," identical," or "equal" are used in description of the example embodiments, it should be understood that some imprecisions may exist. Thus, when one element or one numerical value is referred to as being the same as another element or equal to another numerical value, it should be understood that an element or a numerical value is the same as another element or another numerical value within the manufacturing and/or operational tolerance ranges (e.g., ±10%).

Figure 1:
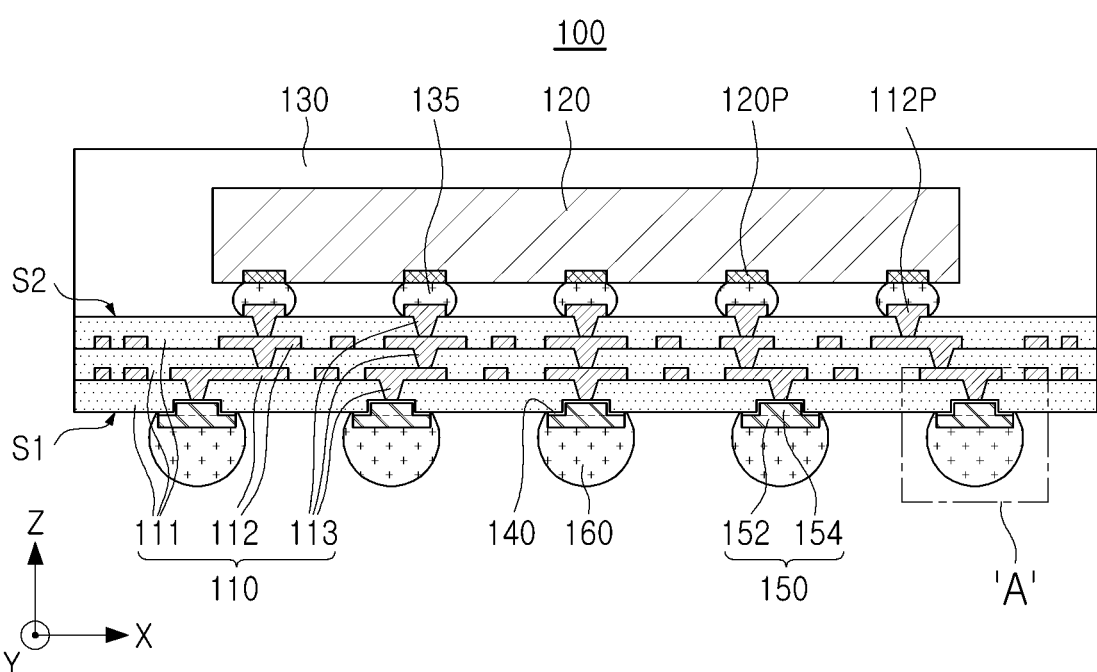
FIG. 1 is a schematic cross-sectional view of a semiconductor package according to some example embodiments.

FIG. 1 is a schematic cross-sectional view of a semiconductor package according to some example embodiments.

Figure 2:
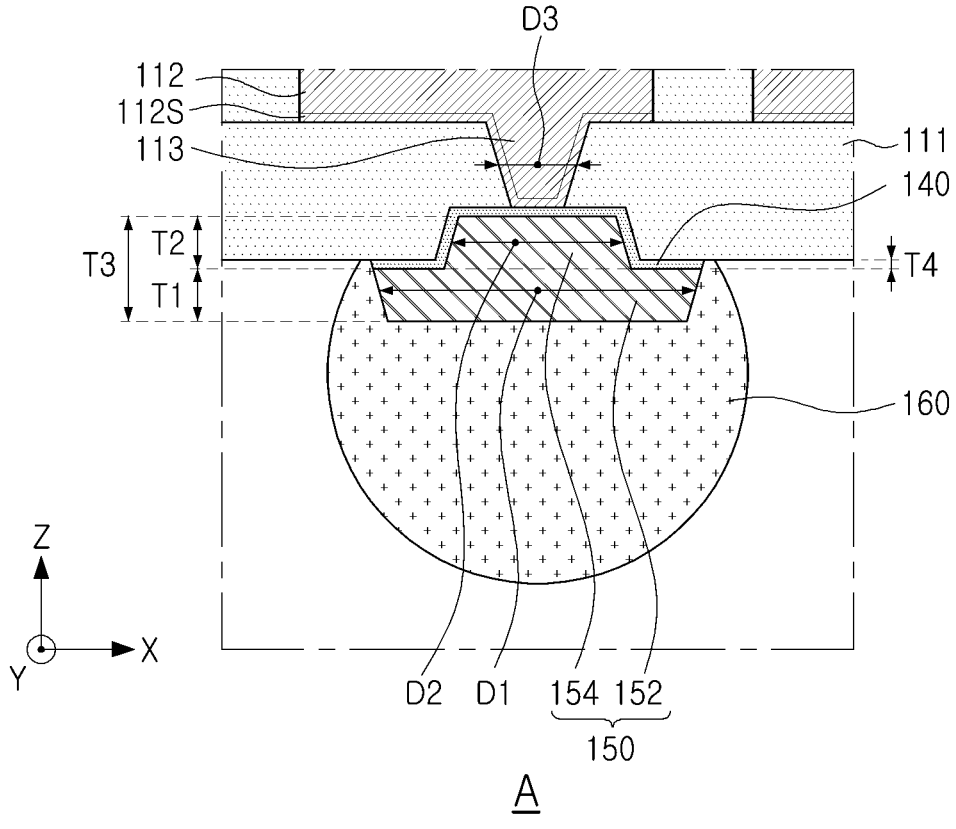
FIG. 2 is a schematic partial enlarged view of a semiconductor package according to some example embodiments.

FIG. 2 is a schematic partial enlarged view of a semiconductor package according to some example embodiments. FIG. 2 is an enlarged view of area 'A' of FIG. 1.

Referring to FIGS. 1 and 2, a semiconductor package 100 may include a redistribution portion 110 including a redistribution layer 112, a semiconductor chip 120 on the redistribution portion 110, a connection portion 135 connecting the semiconductor chip 120 to the redistribution portion 110, an encapsulation layer 130 sealing the semiconductor chip 120, an under-bump metallurgy (UBM) layer 150 disposed below the redistribution portion 110 and including a UBM pad 152 and a UBM via 154, an adhesive layer 140 disposed to cover the upper surface of the UBM layer 150, and connection bumps 160 connected to the UBM layer 150.

The redistribution portion 110 may redistribute connection pads 120P of the semiconductor chip 120. The redistribution portion 110 may include insulating layers 111, redistribution layers 112 disposed on and/or in the insulating layers 111, and redistribution vias 113 vertically connecting the redistribution layers 112 formed on different layers. In some example embodiments, the number of layers of the insulating layers 111 and the redistribution layers 112 constituting the redistribution portion 110 may be variously changed. In some example embodiments, the redistribution portion 110 may correspond to an interposer, and for example, may be an organic interposer.

The insulating layers 111 include an insulating material. The insulating material may be, for example, an organic insulator, such as a thermosetting resin (e.g., an epoxy resin) and/or a thermoplastic resin (e.g., a polyimide). For example, the insulating layers 111 may include a photosensitive insulating material such as a Photo Imageable Dielectric (PID) resin. Additionally and/or alternatively, the insulating layers 111 may include a resin mixed with an inorganic filler. For example, the insulating layers 111 may include an integrated organic-inorganic microfilm (such as Ajinomoto Build-up Film (ABF)). Each of the insulating layers 111 may include the same and/or different materials. A boundary between the insulating layers 111 may not be distinguishable, according to, e.g., the materials constituting the respective layers and/or the production processes.

The redistribution layers 112 and the redistribution vias 113 may form a redistribution structure and may form an electrical path. For example, redistribution layers 112 and the redistribution vias 113 may form an electrical path between a connection pad 120P and a UBM pad 152. Through the redistribution layers 112 and the redistribution vias 113, the semiconductor chip 120 may be redistributed to a region outside of the semiconductor chip 120, for example, to a fan-out area not overlapping the semiconductor chip 120 when viewed in a plan view (e.g., from the Z direction). Accordingly, the semiconductor package 100 may be referred to as a fan-out semiconductor package. The redistribution layers 112 and the redistribution vias 113 may include a ground pattern, a power pattern, and/or a signal pattern. The redistribution layers 112 may be disposed in a line and/or bar shape on the X-Y plane, and the redistribution vias 113 may have a cylindrical and/or conical shape that has a side surface inclined downwardly and narrowed in width. Although the redistribution vias 113 are illustrated as having a filled via structure in which the inside is completely filled with a conductive material, the example embodiments are not limited thereto. For example, the redistribution vias 113 may have a conformal via shape in which a metal material is formed along the inner wall of a via hole.

The redistribution layers 112 and the redistribution vias 113 may include a conductive material, for example, copper (Cu), aluminum (Al), silver (Ag), tin (Sn), gold (Au), nickel (Ni), lead (Pb), titanium (Ti), and/or alloys thereof. In some example embodiments, the redistribution layer 112 and the redistribution via 113 may form an integrated body. As illustrated in FIG. 2, the redistribution layer 112 and the redistribution via 113 may include a seed layer 112S disposed therebelow. The seed layer 112S may extend along a lower surface of the redistribution layer 112, a side surface of the redistribution via 113, and/or a lower surface of the redistribution via 113. The seed layer 112S may be used as a plating seed layer during an electroplating process for forming the redistribution layer 112 and the redistribution via 113. The seed layer 112S may include the same material as that of the redistribution layer 112 and/or the redistribution via 113. The seed layer 112S may have a multilayer structure of, for example, a lower layer including a first conductor (e.g., a metal like titanium (Ti)) and an upper layer including a second conductor (e.g., a metal like copper (Cu)). In some example embodiments, the second conductor may be (and/or include) the same material as the redistribution layer 112 and/or the redistribution via 113. An uppermost redistribution layer 112P among the redistribution layers 112 may serve as a pad for mounting of the semiconductor chip 120. In some embodiments, the uppermost redistribution layer 112P may include a separate surface treatment layer. The surface treatment layer may include, for example, at least one of gold (Au), tin (Sn), silver (Ag), and nickel (Ni).

The semiconductor chip 120 may be disposed on a second surface S2 (e.g., the upper surface) of the redistribution portion 110, and may include lower connection pads 120P. The semiconductor chip 120 may be mounted on the redistribution portion 110, e.g., by a flip-chip bonding method. The semiconductor chip 120 may include a device layer that is located in the lower portion in which the connection pads 120P are disposed and that is provided with an integrated circuit (IC) disposed thereon. The semiconductor chip 120 may be and/or include a logic semiconductor chip and/or a memory semiconductor chip. The logic semiconductor chip may be a micro-processor, for example, a central processing unit (CPU), a controller, an application specific integrated circuit (ASIC), and/or the like. The memory semiconductor chip may be a volatile memory (such as dynamic random access memory (DRAM) and/or a static random access memory (SRAM)) and/or a nonvolatile memory (such as a flash memory).

A body portion of the semiconductor chip 120 may include an elemental and/or compound semiconductor, such as silicon (Si), germanium (Ge), gallium arsenide (GaAs), and/or the like, and the connection pads 120P may include a conductive material such as tungsten (W), aluminum (Al), copper (Cu), and/or the like. A passivation layer exposing the connection pads 120P may be further disposed on the lower surface of the semiconductor chip 120. The passivation layer may include an insulating material. For example, the passivation layer may include at least one of a silicon oxide layer, a silicon nitride layer, and/or the like.

The connection portions 135 may connect the semiconductor chip 120 to the uppermost redistribution layers 112P of the redistribution portion 110. The connection portions 135 may comprise, e.g., a conductive material, and/or may have a land, ball, or pin shape. The connection portions 135 may include, for example, tin (Sn) and/or an alloy (Sn—Ag—Cu) containing tin (Sn). In some embodiments, the connection portions 135 may comprise eutectic alloy such as a solder.

In some embodiments, an underfill layer surrounding the connection portions 135 may be further disposed between the semiconductor chip 120 and the redistribution portion 110. Additionally and/or alternatively, according to example embodiments, the semiconductor chip 120 may also be mounted on the redistribution portion 110 by a wire bonding method.

The encapsulation layer 130 may encapsulate and protect the semiconductor chip 120. For example, the encapsulation layer 130 may be disposed to cover side surfaces and an upper surface of the semiconductor chip 120, but the example embodiments are not limited thereto. The encapsulation layer 130 may include an insulating material, for example, a thermosetting resin such as an epoxy resin, a thermoplastic resin such as polyimide, a prepreg including an inorganic filler and/or glass fiber, an integrated organic-inorganic microfilm (such as ABF), a glass-reinforced laminate material (such as flame retardant 4 (FR-4)), Bismaleimide-Triazine (BT), an Epoxy Molding Compound (EMC), PID, and/or the like.

At least a portion of the UBM layer 150 may be disposed on a first surface S1 (e.g., the lower surface) of the redistribution portion 110 and at least a portion of the UBM layer 150 may be disposed in the redistribution portion 110. For example, the UBM layer 150 may include a UBM pad 152 and a UBM via 154. The UBM pad 152 and the UBM via 154 refer to regions of the UBM layer 150, which are divided into regions for convenience of description. Accordingly, the UBM pad 152 and the UBM via 154 may be integrally formed, and thus the interface therebetween may not exist. In the UBM layer 150, the UBM via 154 may refer to a region buried in the insulating layer 111 of the redistribution portion 110 and having the side surface surrounded with an adhesive layer 140, and the UBM pad 152 may refer to a region positioned on the first surface S1.

The UBM pad 152 may be in physical and/or electrical contact with the connection bump 160, and may be disposed to extend on the lower surface of the insulating layer 111, e.g., along the first surface S1. The upper surface of the UBM pad 152 may be positioned at the same level as and/or lower than the first surface S1 of the insulating layer 111. The upper surface of the UBM pad 152 may be positioned on the same level as the lower surface of the adhesive layer 140, and may extend along the first surface S1 of the insulating layer 111. The upper surface of the UBM pad 152 (e.g., the surface exposed upwardly) may be covered with the adhesive layer 140. The UBM via 154 may penetrate through the insulating layer 111 to connect the redistribution via 113 and the UBM pad 152. The adhesive layer 140 may be interposed between the redistribution via 113 and the UBM pad 152. For example, the upper and side surfaces of the UBM via 154 may be covered with the adhesive layer 140. The lower surface of the UBM via 154 may protrude downwardly by a thickness T4 of the adhesive layer 140 from the lower surface of the insulating layer 111.

As illustrated in FIG. 2, the side surface of the UBM pad 152 and the side surface of the UBM via 154 may have different types of inclinations. For example, the UBM pad 152 and the UBM via 154 may have shapes that are tapered in opposite directions. In some embodiments, the UBM pad 152 may have an inclination that decreases in width downwardly such that the width at the upper end or upper surface is greater than the width at the lower end (and/or lower surface). Alternatively, the UBM via 154 may have an inclination increasing in width toward the bottom such that the width at the upper end or upper surface is smaller than the width at the lower end or lower surface. This shape may be due, for example, to the patterning of the UBM pad 152 and the UBM via 154 in different process operations. This will be described in more detail below with reference to FIGS. 11A to 11K.

The UBM pad 152 may have a first diameter D1, and the UBM via 154 may have a second diameter D2 smaller than the first diameter D1. For example, the first diameter D1 may be in a range of about 200 μm to about 300 μm, and the second diameter D2 may be in a range of about 150 μm to about 250 μm, but the example embodiments are not limited thereto. The first diameter D1 and the second diameter D2 may be, for example, greater than a third diameter D3 of the redistribution via 113 of the redistribution portion 110. The diameters may be, for example, an average (e.g., mean) diameter, a (e.g., median) diameter measured at the center in the thickness direction, and/or may indicate a maximum width in a case in which the UBM pad 152, the UBM via 154, and/or the redistribution via 113 is no longer circular. In a region in which the UBM pad 152 and the UBM via 154 contact each other, the width of the upper end of the UBM pad 152 may be greater than the width of the lower end of the UBM via 154.

The UBM pad 152 may have a first thickness T1, and the UBM via 154 may have a second thickness T2 equal to or different from the first thickness T1. In some example embodiments, the relative sizes of the first thickness T1 and the second thickness T2 may be variously changed. A total thickness T3 of the UBM layer 150 may be, for example, in the range of about 3 μm to about 20 μm, and the first thickness T1 of the UBM pad 152 may range from about 2 μm to about 12 μm, for example, from about 3 μm to about 10 μm. If the first thickness T1 of the UBM pad 152 is smaller than the above range, the wetting effect due to the connection bump 160 being disposed to cover the side surface may be reduced, and if the first thickness T1 of the UBM pad 152 is greater than the above range, it may be difficult to manufacture the UBM pad with a commercially available carrier substrate 10 (refer to FIG. 11A). In some example embodiments, since the UBM pad 152 protrudes downwardly from the redistribution portion 110 and is disposed such that the connection bump 160 covers the side surface of the UBM pad 152, crack generated from the contact point of the connection bump 160, the insulating layer 111, and the UBM pad 152 cannot simply propagate in a straight line (e.g., in the X-direction), and thus the propagation area and/or path may be increased or extended, and thus, reliability may be improved.

The UBM layer 150 may include a conductive material such as copper (Cu), aluminum (Al), silver (Ag), tin (Sn), gold (Au), nickel (Ni), lead (Pb), titanium (Ti), alloys thereof, and/or the like. For example, in some example embodiments, the UBM layer 150 may be formed of copper (Cu). In these cases, the UBM layer 150 may be formed using, for example, a copper foil layer 150P (refer to FIG. 11A) forming a portion of the carrier substrate 10 (refer to FIG. 11A) used during the manufacturing process of the semiconductor package 100. Even when both the UBM layer 150 and the redistribution layers 112 of the redistribution portion 110 include copper (Cu), the UBM layer 150 and the redistribution layers 112 may have different crystal structures. The UBM layer 150 may have a crystal structure different from that of the redistribution vias 113 of the redistribution portion 110. This will be described in more detail with reference to FIGS. 3A and 3B below.

The adhesive layer 140 may be disposed between the UBM layer 150 and the insulating layer 111 and between the UBM layer 150 and the redistribution via 113, to cover the upper surface of the UBM layer 150. The adhesive layer 140 may extend along the upper surface of the UBM layer 150 and may not extend outside the UBM pad 152. The adhesive layer 140 strengthens the adhesion between the UBM layer 150 and the redistribution portion 110 (e.g., the adhesion with the insulating layer 111) thereby improving the reliability of the semiconductor package 100 and facilitating detachment of the carrier substrate 10 (refer to FIG. 11I) during the manufacturing process. To this end, the thickness T4 of the adhesive layer 140 may be, for example, in the range of about 100 nm to about 500 nm. The adhesive layer 140 may include conductive (e.g., a metal and/or metallic) material different from the UBM layer 150 and the redistribution via 113, for example, include titanium (Ti), titanium nitride (TiN), and/or the like.

The connection bumps 160 may be disposed on the first surface S1 of the redistribution portion 110 to cover the entire lower surface and side surfaces of the UBM pad 152. The connection bumps 160 may physically and/or electrically connect the semiconductor package 100 to an external device (not illustrated) such as a main board and/or the like. The connection bumps 160 may have a larger width, size, and/or diameter than the connection portion 135. The connection bumps 160 may include a low-melting-point metal, for example, tin (Sn) or an alloy (Sn—Ag—Cu) including tin (Sn), but the example embodiments are not limited thereto. The connection bumps 160 may have a land, ball, and/or pin shape, and may be formed of a single layer and/or multiple layers. For example, when the connection bumps 160 are formed of multiple layers, the connection bumps 160 may include a copper pillar and solder.

In some example embodiments, the shape, number, spacing, arrangement, and/or the like of the connection bumps 160 may be variously changed. For example, tens to thousands of connection bumps 160 may be disposed. A portion of the connection bumps 160 may be disposed in the fan-out area.

Figure 3A:
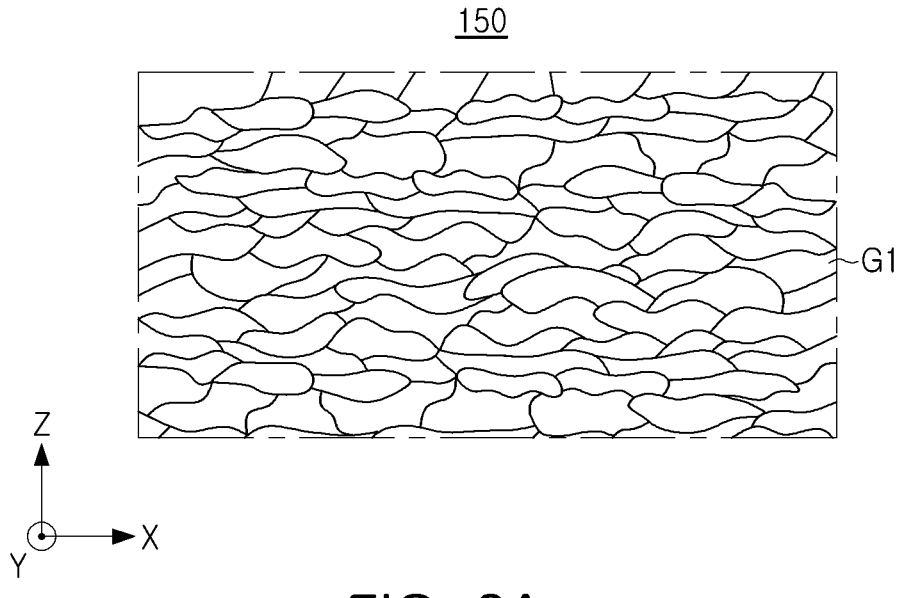
FIGS. 3A and 3B are diagrams illustrating a crystal structure of some regions of a semiconductor package according to some example embodiments.
Figure 3B:
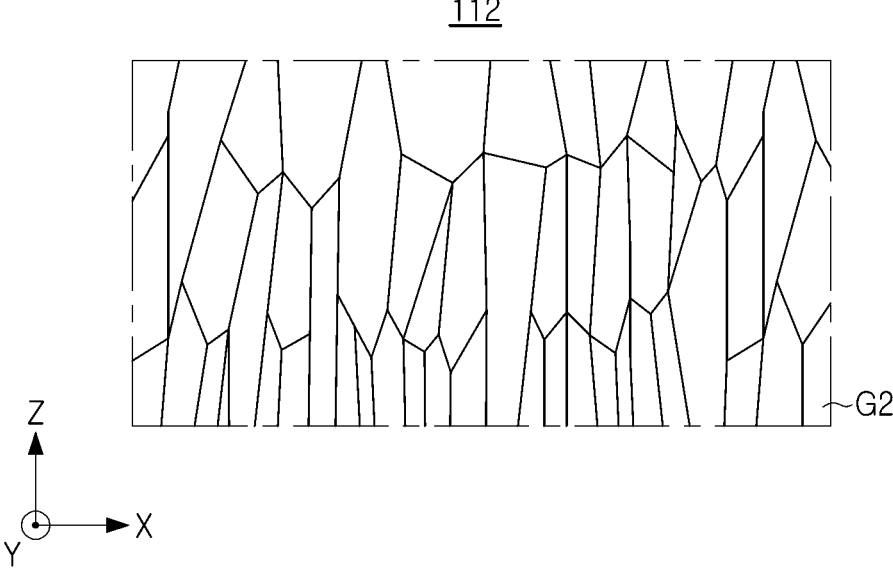

FIGS. 3A and 3B are diagrams illustrating a crystal structure of some regions of a semiconductor package according to example embodiments.

FIGS. 3A and 3B illustrate a crystal structure of a case in which the UBM layer 150 and the redistribution layer 112 of the semiconductor package 100 of FIGS. 1 and 2 are formed of the same material (e.g., copper (Cu)).

Referring to FIG. 3A, the UBM layer 150 may be formed, as described above, using the second metal foil layer 150P (refer to FIG. 11A) that forms a portion of the carrier substrate 10 (refer to FIG. 11A) used during the manufacturing process of the semiconductor package 100. The second metal foil layer 150P may be manufactured, e.g., by being rolled by rollers, and thus, may have a crystal structure including pancaked grains G1 in a form pressed in the Z direction, for example, a form extending in the X and Y directions.

Referring to FIG. 3B, the redistribution layer 112 is grown from the seed layer 112S (refer to FIG. 2) by a plating process and/or a sputtering process, and thus, may have a crystal structure including columnar grains G2 relatively elongated in the Z direction. The redistribution via 113 (refer to FIG. 2) may also have the same crystal structure as the redistribution layer 112.

As such, even when the UBM layer 150, the redistribution layer 112, and the redistribution via 113 equally include the same material (e.g., copper (Cu)), the UBM layer 150 may have a crystal structure different from that of the redistribution layer 112 and the redistribution via 113. The grains G1 constituting the UBM layer 150 may mainly have a flat shape extending in the X-direction and the Y-direction, and the grains G2 constituting the redistribution layer 112 and the redistribution via 113 may mainly have an elongated shape extending in the Z direction. This difference in crystal structure may be easily analyzed, e.g., through an electron microscope analysis such as a transmission electron microscope (TEM).

Figure 4A:
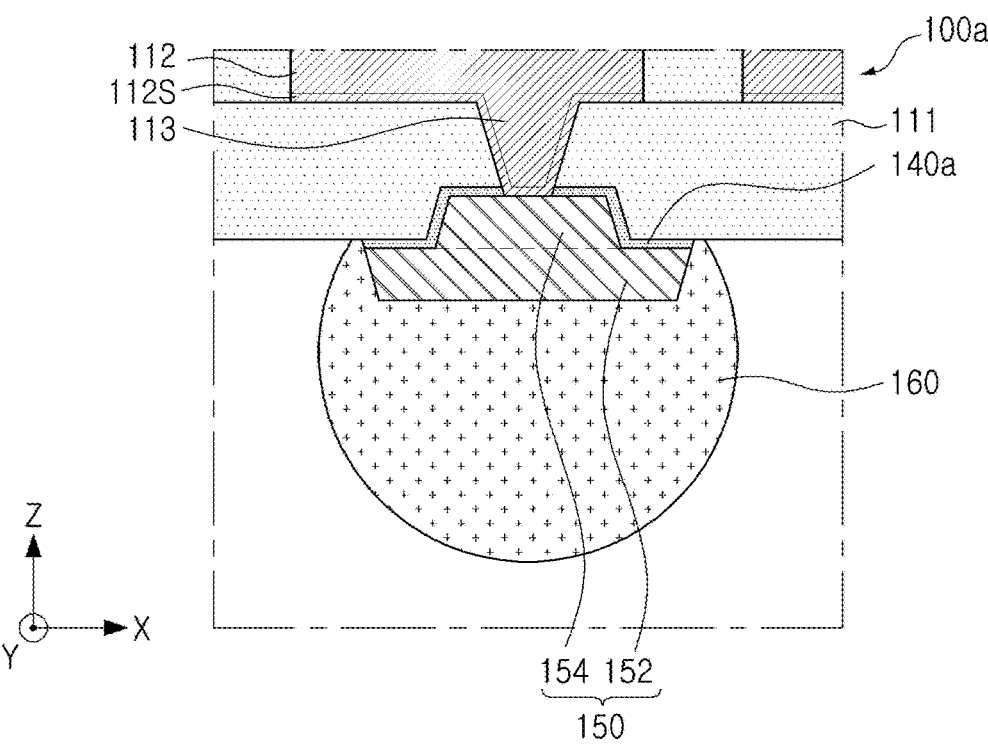
FIGS. 4A and 4B are partially enlarged views of a semiconductor package according to some example embodiments.
Figure 4B:
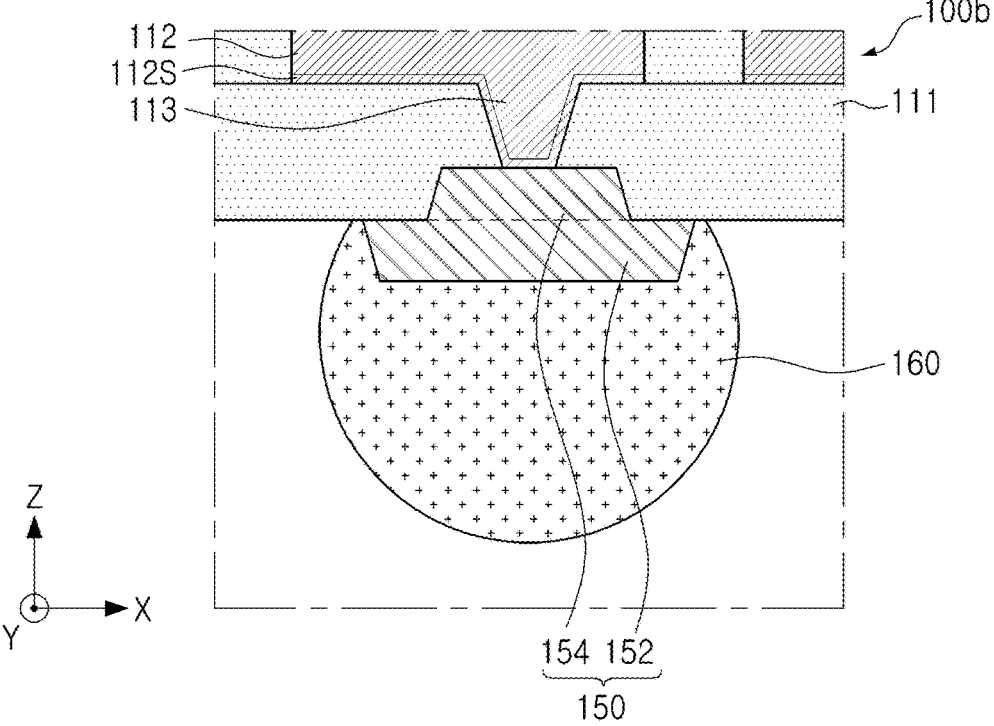

FIGS. 4A and 4B are partially enlarged views of a semiconductor package according to example embodiments. FIGS. 4A and 4B respectively illustrate regions corresponding to FIG. 2.

Referring to FIG. 4A, in a semiconductor package 100a, an adhesive layer 140a may be disposed around the redistribution via 113 but without being interposed between the redistribution via 113 and a UBM via 142. The adhesive layer 140a may not cover the lower surface of the redistribution via 113. Accordingly, the redistribution via 113 may be directly connected to the UBM via 142.

The form of the adhesive layer 140a may be formed, during the manufacturing process of the semiconductor package 100 described with reference to FIG. 11E below, by removing the adhesive layer 140a exposed through a via hole VH during formation of the via hole VH.

Referring to FIG. 4B, in a semiconductor package 100b, the adhesive layer 140 (refer to FIGS. 1 and 2) may be omitted. In these cases, the upper surface of the UBM layer 150 may be in direct contact with the insulating layer 111. The adhesive layer 140 may be omitted as described above, in the cases in which, for example, adhesive force between the insulating layer 111 and the second metal foil layer 150P (refer to FIG. 11A) constituting the UBM layer 150 is secured during the process.

Figure 5A:
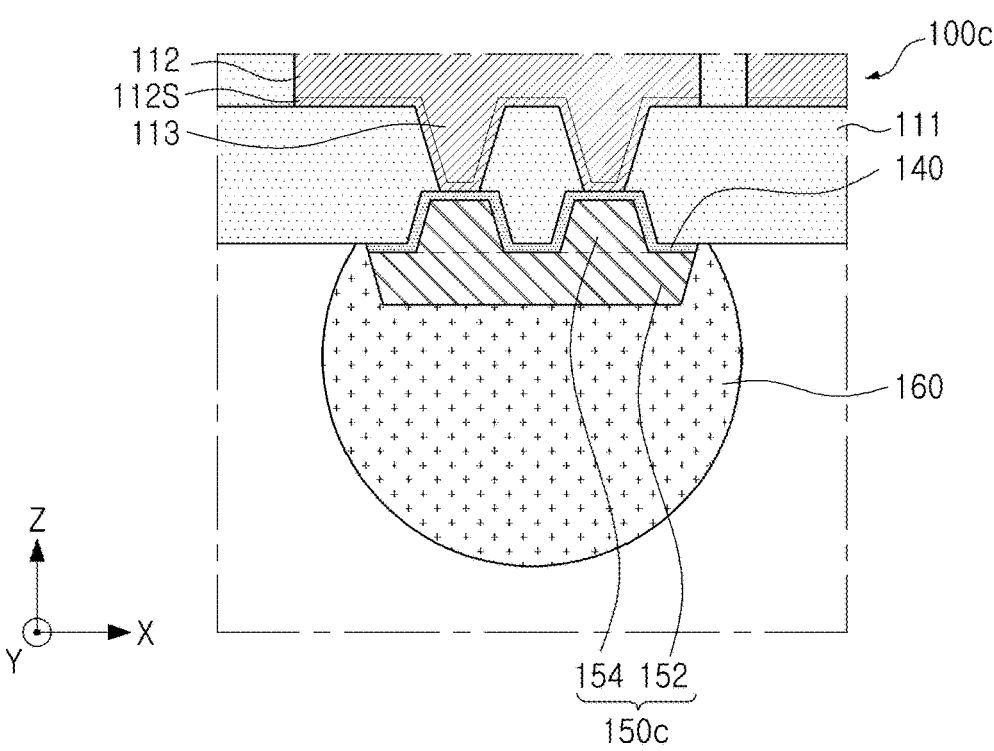
FIGS. 5A and 5B are partially enlarged views of a semiconductor package according to some example embodiments.
Figure 5B:
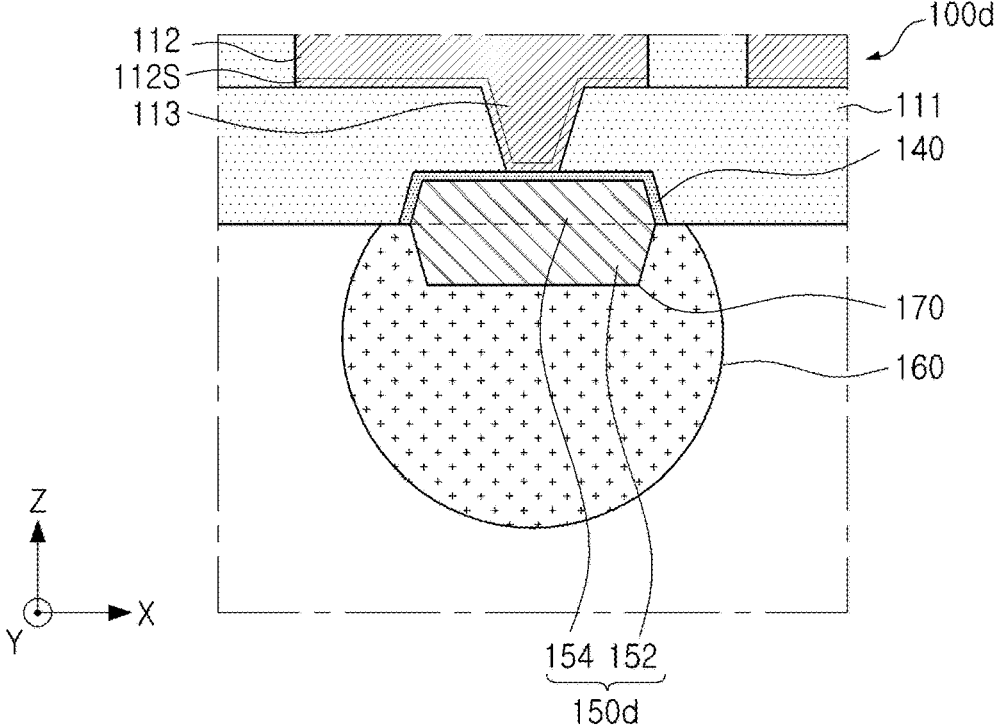

FIGS. 5A and 5B are partially enlarged views of a semiconductor package according to some example embodiments. FIGS. 5A and 5B respectively illustrate regions corresponding to FIG. 2.

Referring to FIG. 5A, in a semiconductor package 100c, a UBM layer 150c may include a plurality of UBM vias 154. As the UBM vias 154, two or more, for example, four UBM vias 154 may be disposed on the upper surface of the UBM pad 152 to be spaced apart from each other. In some example embodiments, the number of UBM vias 154 may change variously. Each of the UBM vias 154 may have a diameter in a range of, for example, about 30 μm to about 70 μm. However, the size of the UBM vias 154 may be variously changed according to the size of the UBM pad 152 and the number of UBM vias 154.

Each of the UBM vias 154 may be connected to the redistribution via 113, but the configuration is not limited thereto. In some example embodiments, the adhesive layer 140 may be disposed to cover the upper and side surfaces of each of the UBM vias 154 and to cover the upper surface of the UBM pad 152. However, the example embodiments are not limited thereto. For example, in some example embodiments, the adhesive layer 140 may not be disposed between the UBM vias 154 and the redistribution vias 113 and/or may be omitted.

Referring to FIG. 5B, in a semiconductor package 100d, in the case of a UBM layer 150d, the diameter of the UBM pad 152 and the diameter of the UBM via 154 may be substantially the same. For example, the width on the upper surface of the UBM pad 152 and the width on the lower surface of the UBM via 154 may be substantially the same. However, even in this case, the inclined shapes of the side surfaces of the UBM pad 152 and the UBM via 154 may be different from each other, and may be tapered in opposite directions, as described above with reference to FIGS. 1 and 2.

As such, in some example embodiments, the relative diameters of the UBM pad 152 and the UBM via 154 may be variously changed within a range in which the diameter of the UBM pad 152 is not smaller than the diameter of the UBM via 154.

Figures 6A, 6B:
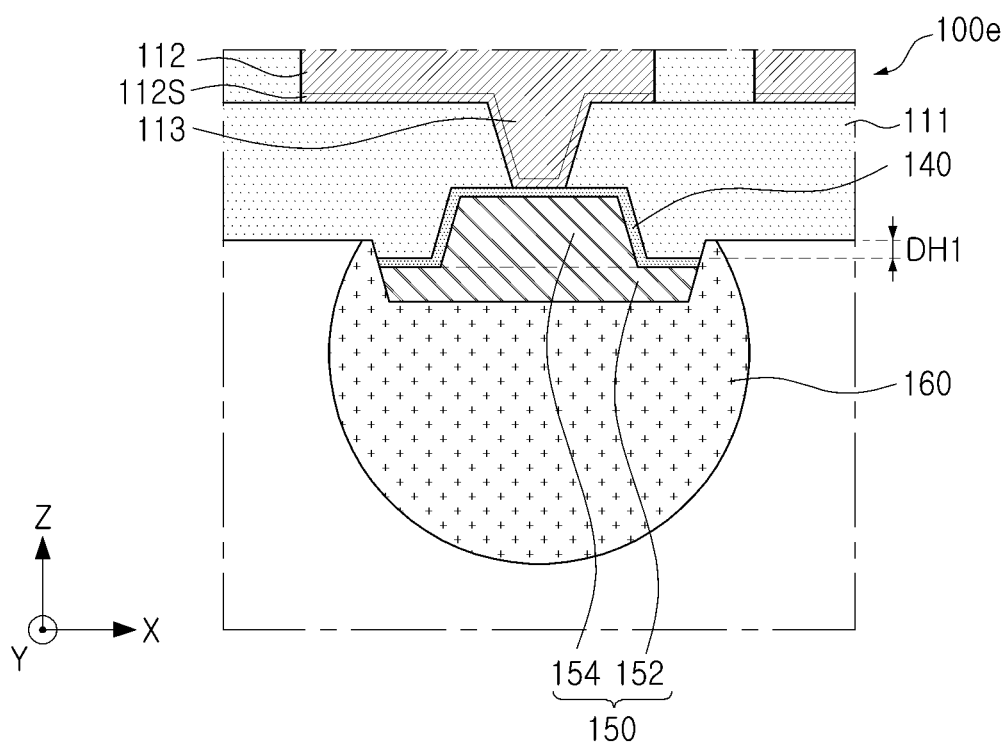
FIGS. 6A and 6B are partially enlarged views of a semiconductor package according to some example embodiments.

FIGS. 6A and 6B are partially enlarged views of a semiconductor package according to some example embodiments. FIGS. 6A and 6B respectively illustrate regions corresponding to FIG. 2.

Referring to FIG. 6A, in a semiconductor package 100e, a lowermost insulating layer 111 may have a shape recessed upwardly in the periphery of the UBM layer 150. For example, the lower surface of the insulating layer 111 (e.g., the first surface S1 of FIG. 1) may be recessed upwardly by a first depth DH1 in the outer region of side surfaces of the UBM pad 152 and the adhesive layer 140. The side surface of the insulating layer 111 formed thereby may be covered with the connection bump 160, but the example embodiments are not limited thereto.

The shape of the insulating layer 111 may be formed, e.g., by removing a portion of the insulating layer 111 together with the second metal foil layer 150P during a manufacturing process of the semiconductor package 100 described below with reference to FIG. 11K.

Referring to FIG. 6B, a semiconductor package 100f may further include a surface treatment layer 170 disposed on the lower surface of the UBM layer 150. The surface treatment layer 170 may be disposed on the lower surface of the UBM pad 152. The surface treatment layer 170 may be formed of a single layer and/or multiple layers. The surface treatment layer 170 may include a material different from that of the UBM pad 152. For example, the surface treatment layer 170 may include at least one of gold (Au), tin (Sn), silver (Ag), and nickel (Ni). The material of the surface treatment layer 170 may be selected such that the surface treatment layer 170 improves the durability of the UBM pad 152 and/or improves adhesion between the UBM pad 152 and the connection bump 160.

The surface treatment layer 170 may be formed before the formation of a second mask layer ML2, for example, during a manufacturing process of the semiconductor package 100 described with reference to FIG. 11J below.

Figure 7A:
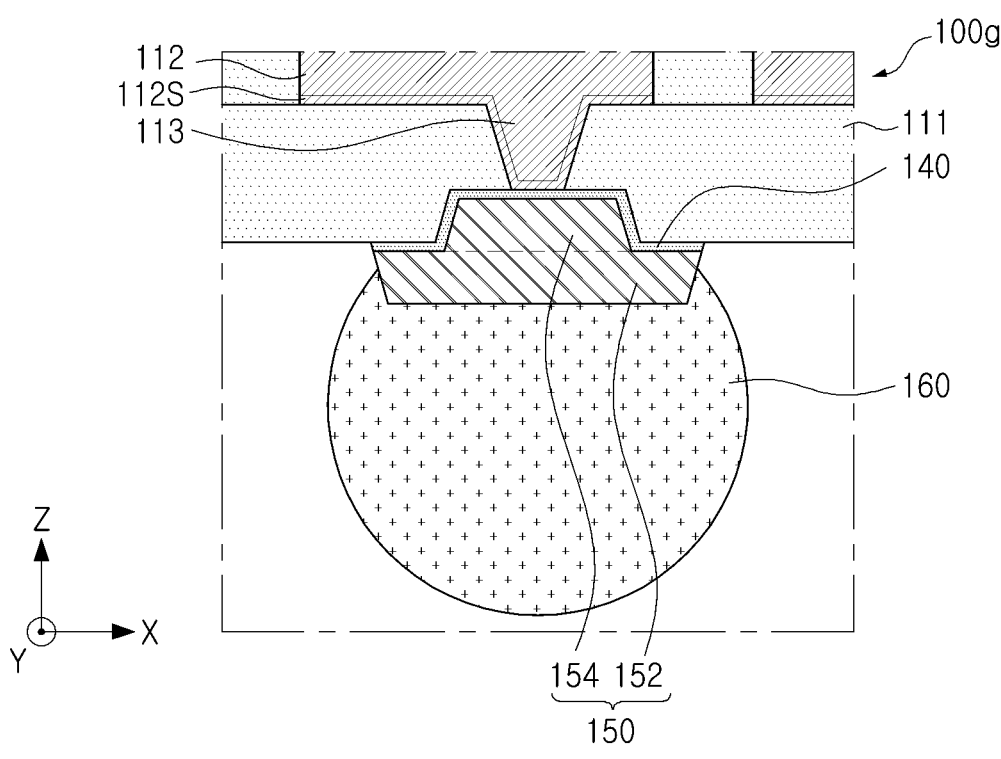
FIGS. 7A and 7B are partially enlarged views of a semiconductor package according to some example embodiments.
Figure 7B:
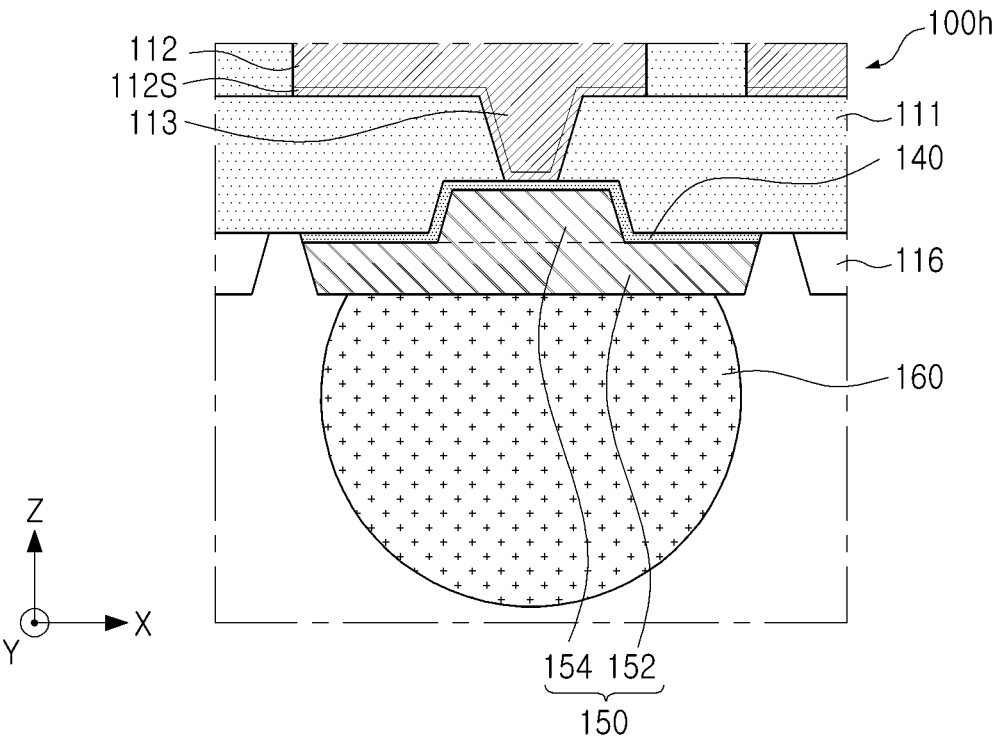

FIGS. 7A and 7B are partially enlarged views of a semiconductor package according to some example embodiments. FIGS. 7A and 7B respectively illustrate regions corresponding to FIG. 2.

Referring to FIG. 7A, in a semiconductor package 100g, the connection bump 160 may be disposed to cover only a portion of the side surface of the UBM pad 152, for example, a lower region. In some example embodiments, the degree to which the connection bump 160 covers the side surface of the UBM pad 152 may be variously changed.

Referring to FIG. 7B, in a semiconductor package 100h, the connection bump 160 is disposed on the lower surface of the UBM pad 152 and may not cover the side surface. As such, in some example embodiments, the arrangement of the connection bump 160 may be changed according to the relative sizes of the connection bump 160 and the UBM pad 152, the bonding process of the connection bumps 160, and/or the like.

The redistribution portion 110 (refer to FIG. 1) of the semiconductor package 100h may further include a passivation layer 116 disposed on a lower surface of the lowermost insulating layer 111. The passivation layer 116 may be disposed to be laterally spaced apart from the UBM layer 150. The passivation layer 116 may protect the redistribution portion 110 and may be disposed to expose the UBM layer 150. The passivation layer 116 may include an insulating material, for example, a thermosetting resin (such as an epoxy resin) and/or a thermoplastic resin (such as polyimide). The passivation layer 116 of the present example embodiments is not related to the arrangement of the connection bumps 160 and may be, e.g., independently combined with other embodiments.

Figure 8:
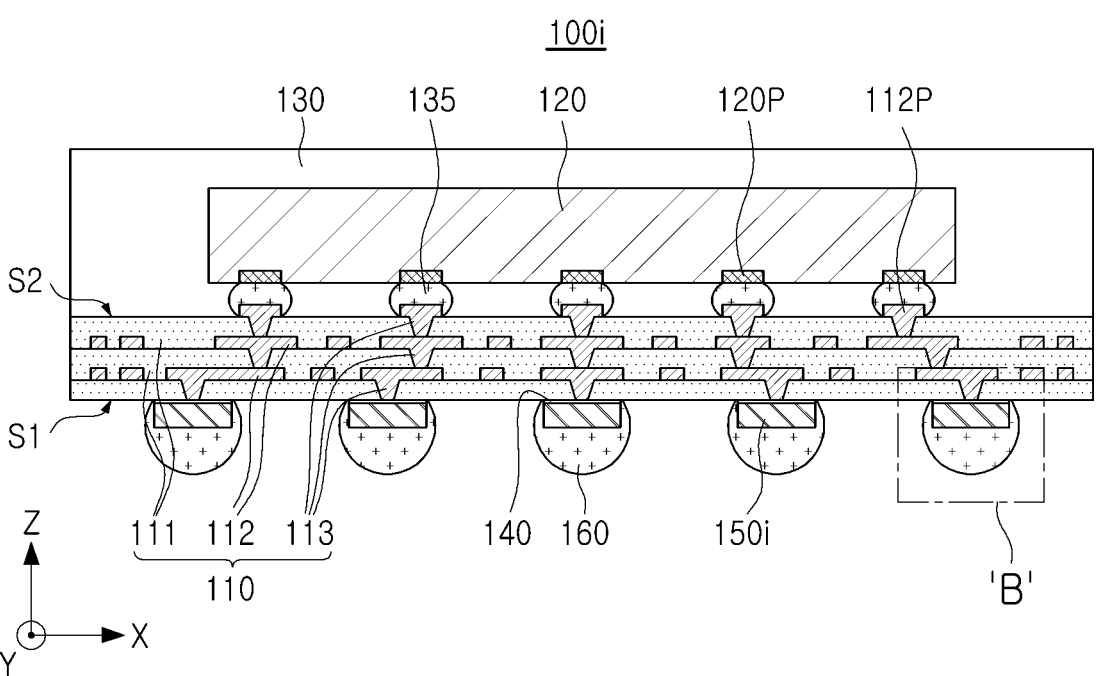
FIG. 8 is a schematic cross-sectional view of a semiconductor package according to some example embodiments.

FIG. 8 is a schematic cross-sectional view of a semiconductor package according to some example embodiments.

Figure 9:
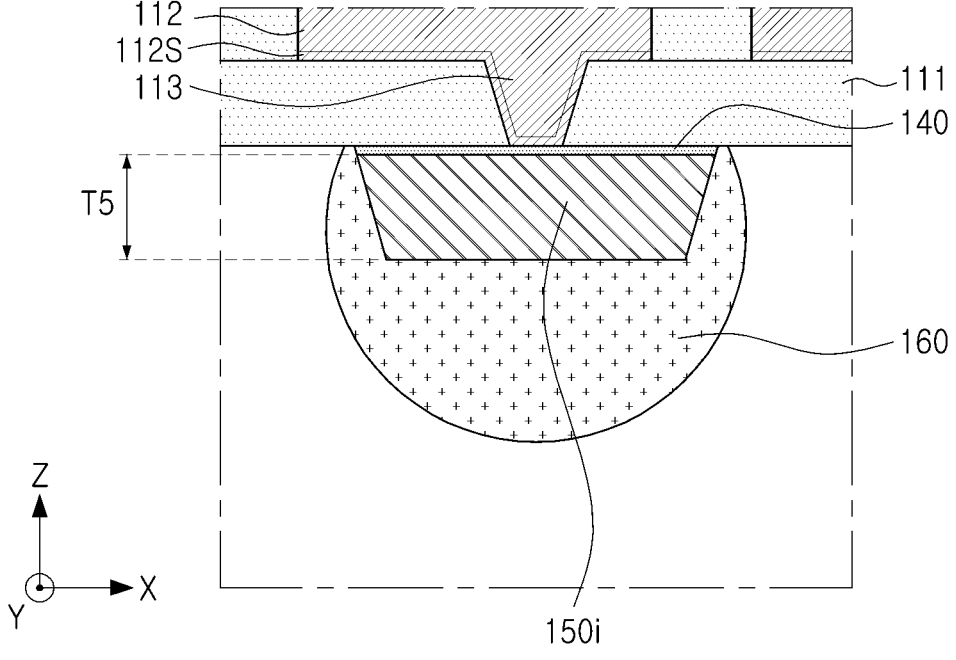
FIG. 9 is a schematic partially enlarged view of a semiconductor package according to some example embodiments.

FIG. 9 is a schematic partially enlarged view of a semiconductor package according to some example embodiments. FIG. 9 is an enlarged view of area 'B' of FIG. 8.

Referring to FIGS. 8 and 9, in a semiconductor package 100i, a UBM layer 150i may have a shape different from that of FIGS. 1 and 2. The UBM layer 150i does not include a region corresponding to the UBM via 154 of FIG. 2, and may be entirely disposed on the first surface S1 of the insulating layer 111. The UBM layer 150i may be disposed on lower surfaces of the insulating layer 111 and the redistribution via 113 of the redistribution portion 110, with the adhesive layer 140 interposed therebetween. An upper surface of the UBM layer 150i may be covered with an adhesive layer 140, and at least a portion of a side surface and a lower surface of the UBM layer 150i may be covered with a connection bump 160.

The UBM layer 150i may have an inclination that decreases in width downwardly such that the width and/or diameter on the upper end or upper surface is greater than the width and/or diameter on the lower end or lower surface, as illustrated in FIG. 9. However, according to some example embodiments, the inclination angle of the side surface of the UBM layer 150i may be variously changed within the above range. A thickness T5 of the UBM layer 150i may range from, for example, about 3 μm to about 20 μm. As described above, the UBM layer 150i may have a crystal structure different from that of the redistribution layers 112 and the redistribution vias 113.

For the UBM layer 150i and other components, the description described above with reference to FIGS. 1 and 2 may be equally applied. Also, the semiconductor package 100i may be combined with the example embodiments of FIGS. 4A, 4B, and/or 6A to 7B.

Figure 10:
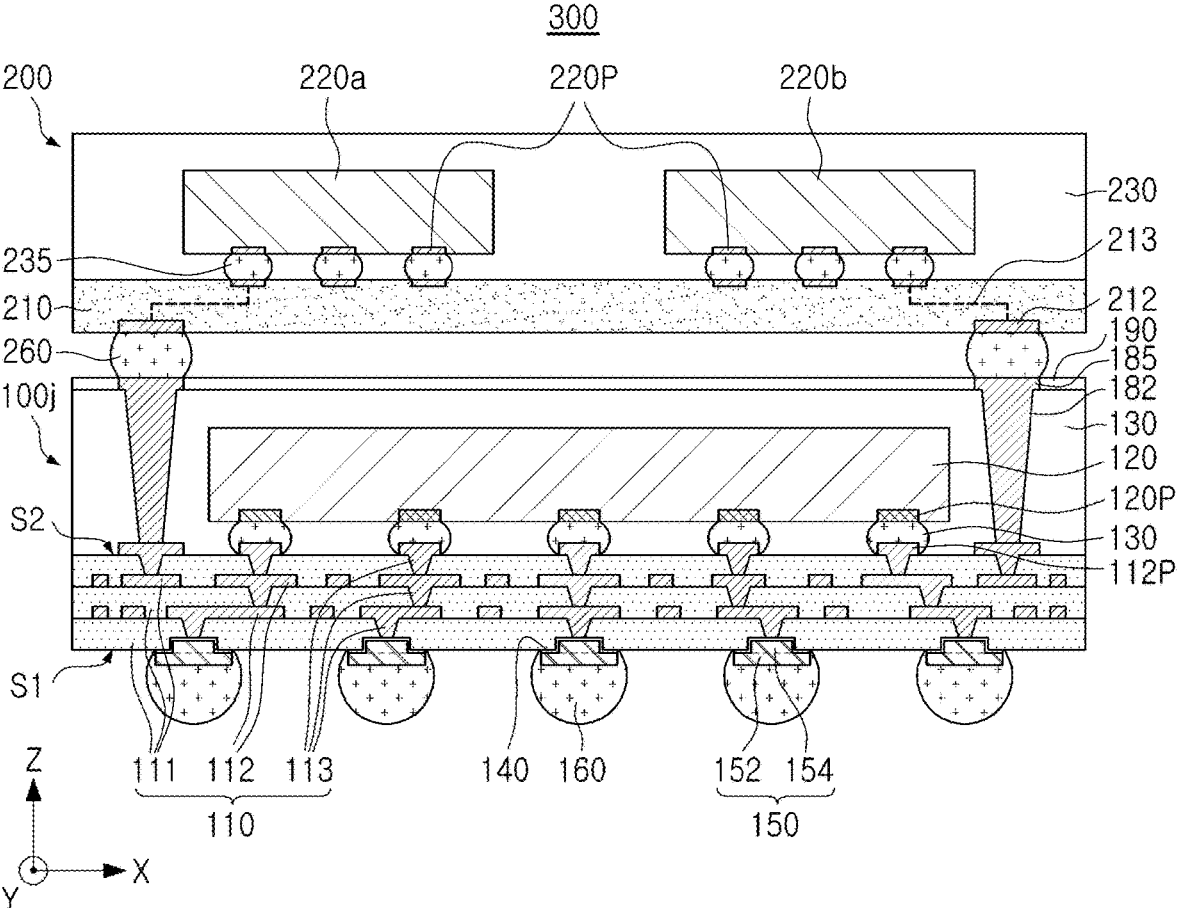
FIG. 10 is a schematic cross-sectional view of a semiconductor package according to some example embodiments.

FIG. 10 is a schematic cross-sectional view of a semiconductor package according to some example embodiments.

Referring to FIG. 10, a semiconductor package 300 may further include a second semiconductor package 200 disposed on a first semiconductor package 100j. For example, the semiconductor package 300 may be a package on package (POP) type in which the second semiconductor package 200 is stacked on the first semiconductor package 100j, and may functionally be a system in package (SIP).

Compared to the semiconductor package 100 described above with reference to FIG. 1, the first semiconductor package 100j may further include conductive posts 182 penetrating through the encapsulation layer 130, upper pads 185 on the conductive posts 182, and a passivation layer 190. The conductive posts 182 may connect an uppermost redistribution layer 112P and the upper pads 185. The conductive posts 182 and the upper pads 185 may include a conductive material such as metal. The passivation layer 190 may be disposed on the upper surface of the encapsulation layer 130 and may include an insulating material.

Although the first semiconductor package 100j has a structure including the UBM layer 150 in the example embodiment of FIGS. 1 and 2, the configuration is not limited thereto. In some example embodiments, any one of the example embodiments described above with reference to FIGS. 4A to 9 may be employed for the first semiconductor package 100j.

The second semiconductor package 200 may include a substrate 210, upper semiconductor chips 220a and 220b, an upper encapsulation layer 230, upper connection portions 235, and upper connection bumps 260.

A substrate 210 may include conductive pads 212 exposed through upper and lower surfaces. The substrate 210 may include, for example, silicon (Si), glass, ceramic, and/or plastic. The substrate 210 may include an electrical path 213 by interconnection patterns therein, and may have a multi-layered structure.

The upper semiconductor chips 220a and 220b may include a logic semiconductor chip and/or a memory semiconductor chip. The upper semiconductor chips 220a and 220b may be the same and/or different chip types. The upper semiconductor chips 220a and 220b may have a device layer disposed in a lower portion thereof, and lower surfaces of the upper semiconductor chips 220a and 220b may be active surfaces, but the arrangement position of the active surface may be variously changed in example embodiments.

The upper encapsulation layer 230 is disposed to surround the upper semiconductor chips 220a and 220b, and may serve to protect the upper semiconductor chips 220a and 220b. The upper encapsulation layer 230 may be formed of, for example, a silicone-based material, a thermosetting material, a thermoplastic material, a UV-treated material, and/or the like.

The upper connection portions 235 may electrically connect the upper semiconductor chips 220a and 220b to the upper pads 212 of the substrate 210. The upper connection portions 235 may include low-melting-point metal such as a solder, but the example embodiments are not limited thereto. For example, the upper connection portions 235 may include various types of signal transmission media such as wires and/or the like.

The upper connection bumps 260 may be disposed on the lower surface of the substrate 210. The upper connection bumps 260 may connect the second semiconductor package 200 to the first semiconductor package 100j provided therebelow, thereby electrically connecting the first and second semiconductor packages 100j and 200 to each other. The upper connection bumps 260 may include a conductive material, for example, at least one of solder, tin (Sn), silver (Ag), copper (Cu), aluminum (Al), an alloy thereof, and/or the like. In some example embodiments, an upper UBM layer having the same structure as the UBM layer 150 may be further disposed between the upper pads 212 and the upper connection bumps 260 that are connected to each other.

The structure of the second semiconductor package 200 is an example, and semiconductor packages having various structures may be stacked on the first semiconductor package 100j. In some example embodiments, an interposer substrate may be further disposed between the first semiconductor package 100j and the second semiconductor package 200.

FIGS. 11A to 11K are main step-by-step views schematically illustrating a method of manufacturing a semiconductor package according to some example embodiments. FIGS. 11A to 11K illustrate an example method of manufacturing the semiconductor package of FIGS. 1 and 2.

Figure 11A:
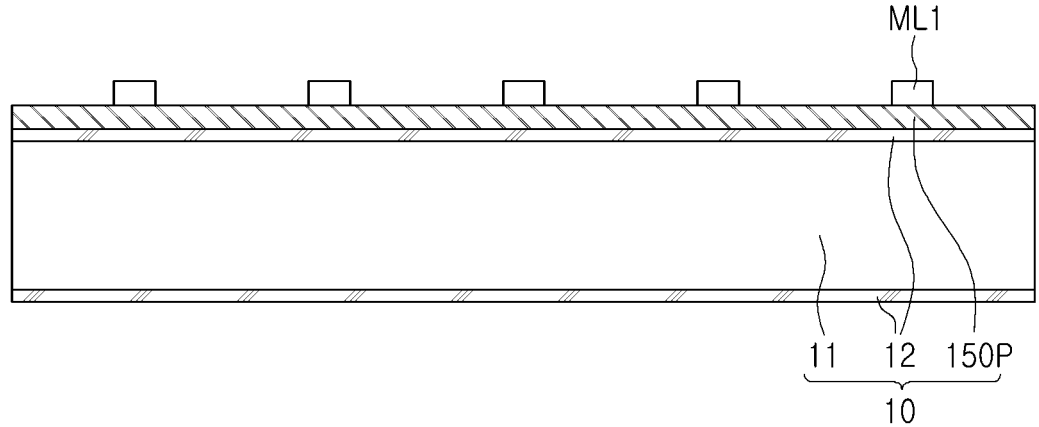
FIGS. 11A to 11K are main step-by-step views schematically illustrating a method of manufacturing a semiconductor package according to some example embodiments.

Referring to FIG. 11A, a first mask layer ML1 may be formed on a carrier substrate 10.

The carrier substrate 10 may include a core layer 11, a first metal foil layer 12 on the upper and lower surfaces of the core layer 11, and a second metal foil layer 150P that is disposed on the first metal foil layer 12 located on the upper surface of the core layer 11. The core layer 11 may include an insulating resin and an inorganic filler (e.g., a glass fiber), and may be, for example, a prepreg. The first metal foil layer 12 and the second metal foil layer 150P may include a metal (and/or metallic) material, for example, copper (Cu), and may each be formed of a copper foil. The core layer 11 may further include an organic release layer disposed between the first metal foil layer 12 and the second metal foil layer 150P. The second metal foil layer 150P may be a layer forming the UBM layer 150 (refer to FIG. 1) through a subsequent process. The carrier substrate 10 may have a structure in which a detachable Cu foil corresponding to the organic release layer and the second metal foil layer 150P is attached onto a copper clad laminate (CCL) corresponding to the core layer 11 and the first metal foil layer 12.

The first mask layer ML1 may be patterned and formed by a photolithography process. For example, the first mask layer ML1 may be formed on the second metal foil layer 150P to correspond to a region in which the UBM vias 154 (refer to FIG. 1) are to be formed. The first mask layer ML1 may include, for example, a dry film resist (DFR).

Figure 11B:
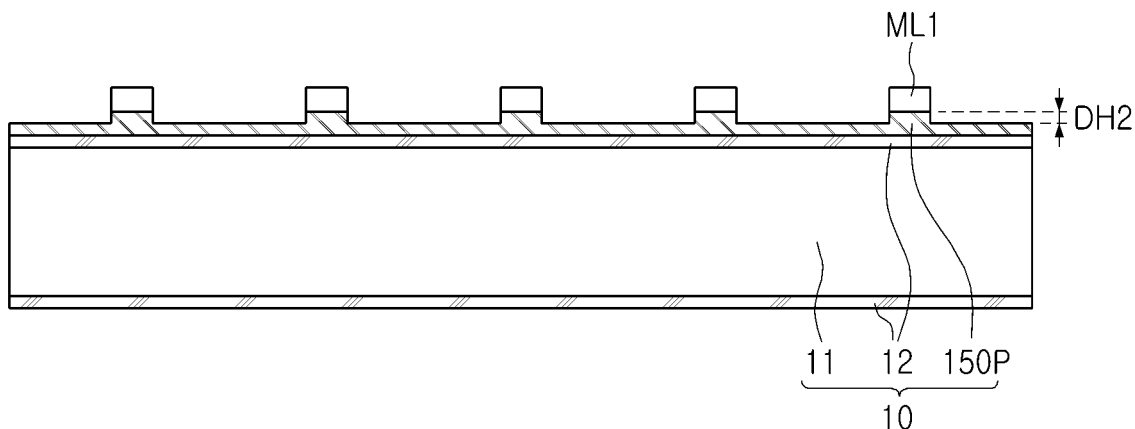

Referring to FIG. 11B, an upper portion of the second metal foil layer 150P may be patterned using the first mask layer ML1. For example, portion of the second metal foil layer 150P not protected by the first mask layer ML1 may be partially removed.

By performing an etching process using the first mask layer ML1 as a mask, the second metal foil layer 150P may be removed from the upper surface to a predetermined depth DH2 and/or a thickness. The depth DH2 may correspond to the thickness of the UBM vias 154 (refer to FIG. 1). The depth DH2 may be, for example, half of the total thickness of the second metal foil layer 150P or similar thereto, and may be variously changed in the example embodiments. In this operation, regions forming the UBM vias 154 may be formed.

Figure 11C:
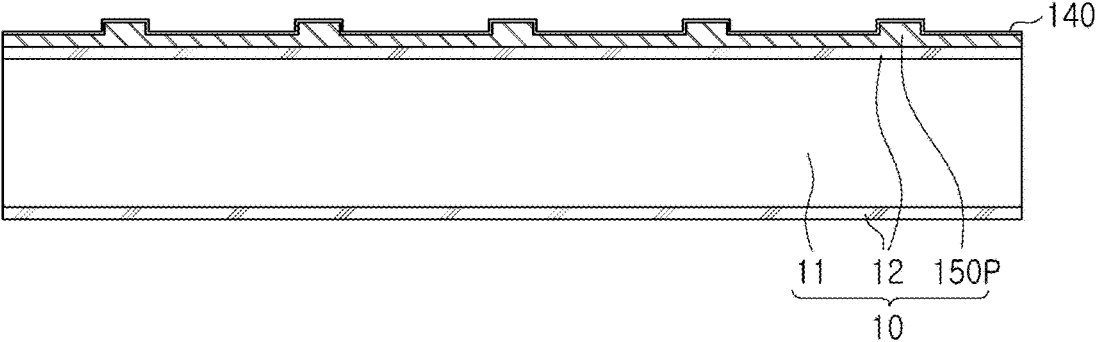

Referring to FIG. 11C, the adhesive layer 140 may be formed on the patterned second metal foil layer 150P.

The adhesive layer 140 may be formed by, for example, a sputtering process. The adhesive layer 140 may be conformally formed along the patterned upper surface of the second metal foil layer 150P. The adhesive layer 140 may include a metal material, for example, titanium (Ti).

Figure 11D:
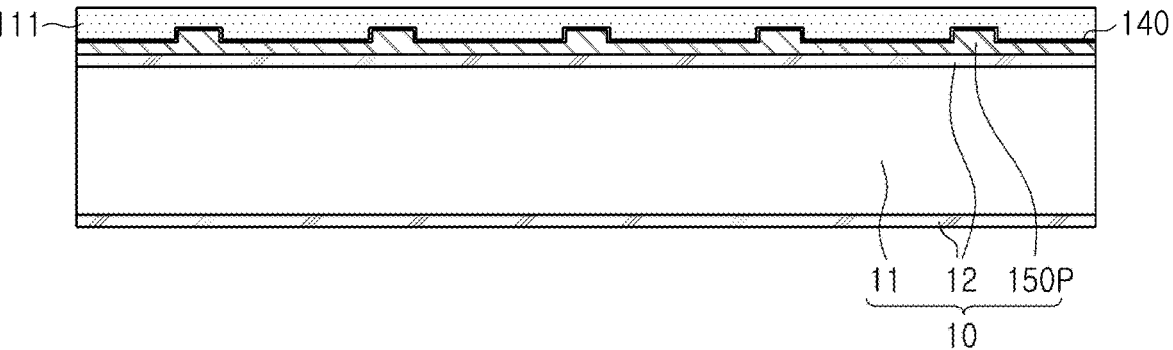

Referring to FIG. 11D, the insulating layer 111 of the redistribution portion 110 (refer to FIG. 1) may be formed on the adhesive layer 140.

The insulating layer 111 includes an insulating material, for example, PID. The insulating layer 111 may be formed by laminating and/or coating the PID onto the adhesive layer 140 and/or on the patterned second metal foil 150P. The insulating layer 111 may be formed to cover the curved upper surfaces of the second metal foil layer 150P and the adhesive layer 140 and to have a flat upper surface. In the present embodiment, since the second metal foil layer 150P is partially patterned from the upper portion, undulation may be significantly reduced when the insulating layer 111 is formed on the second metal foil layer 150P.

Figure 11E:
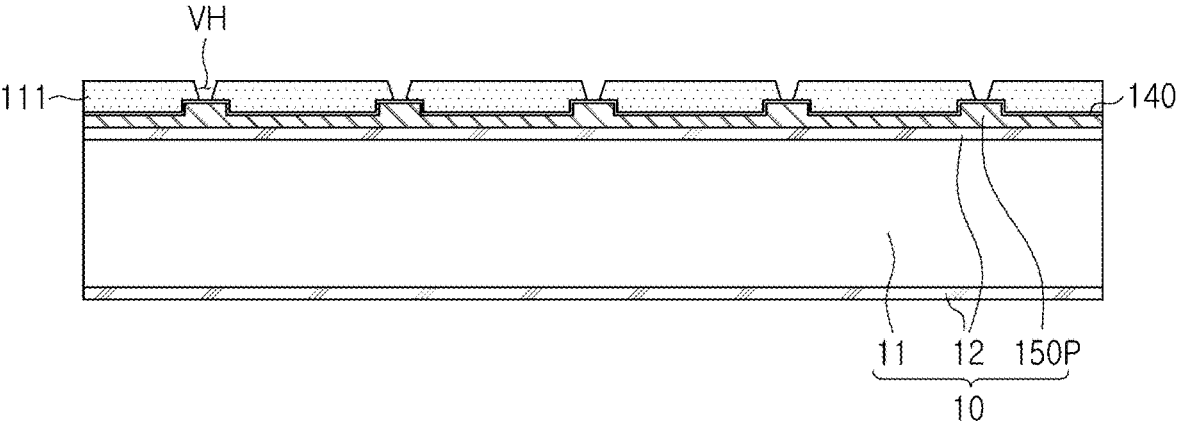

Referring to FIG. 11E, the insulating layer 111 may be patterned to form via holes VH.

The via holes VH may be formed by a photolithography process and an etching process. The via holes VH may be formed on protruding regions (not illustrated) formed as the second metal foil layer 150P is not removed and remains, and may be formed to expose the adhesive layer 140 provided therebelow.

Figure 11F:
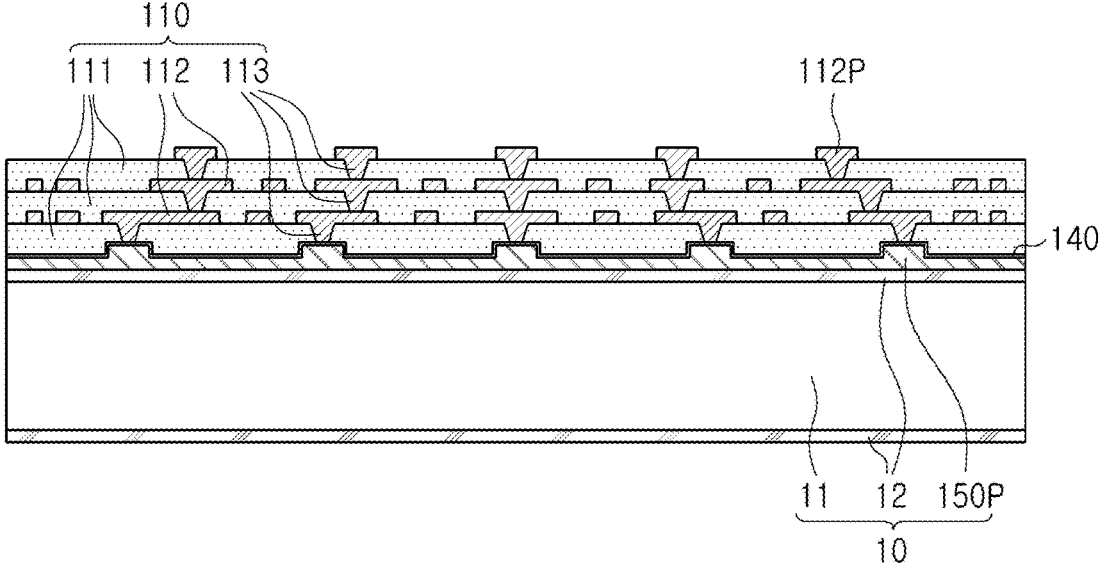

Referring to FIG. 11F, the redistribution portion 110 may be formed by repeatedly performing the process of forming the redistribution vias 113 by filling the via holes VH, forming the redistribution layers 112, and forming the insulating layer 111.

The redistribution vias 113 and the redistribution layers 112 may be formed by exposing an area in which patterns are to be formed by using a dry film etch and/or the like, forming a seed layer 122S (refer to FIG. 2) in the exposed area, and filling a conductive material using a plating process. The redistribution portion 110 may be formed by repeating the process of forming the insulating layer 111, the redistribution vias 113, and the redistribution layers 112. An uppermost redistribution layer 112P may be formed to protrude on the upper surface of the redistribution portion 110. In some embodiments, after the formation of the redistribution portion 110, an electrical inspection of the redistribution structure may be further performed.

Figure 11G:
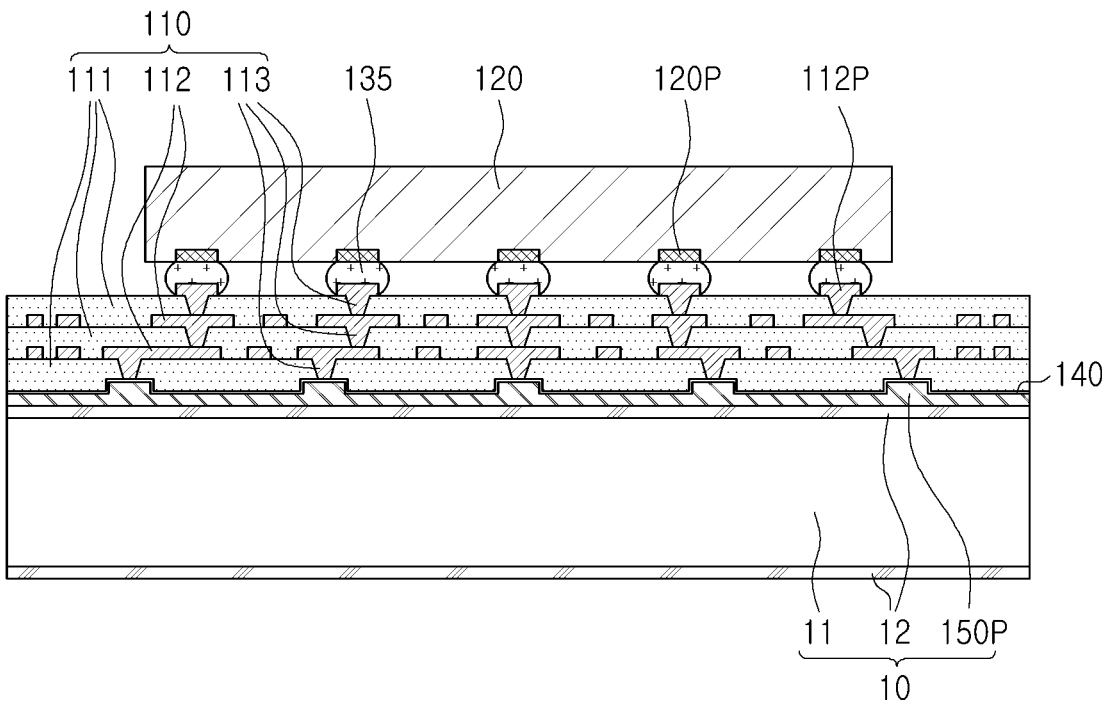

Referring to FIG. 11G, the semiconductor chip 120 may be mounted on the redistribution portion 110.

The semiconductor chip 120 may be mounted on the redistribution portion 110 by solder bonding by the connection portions 135. The semiconductor chip 120 may be physically and electrically connected to the uppermost redistribution layer 112P through the connection portions 135.

Figure 11H:
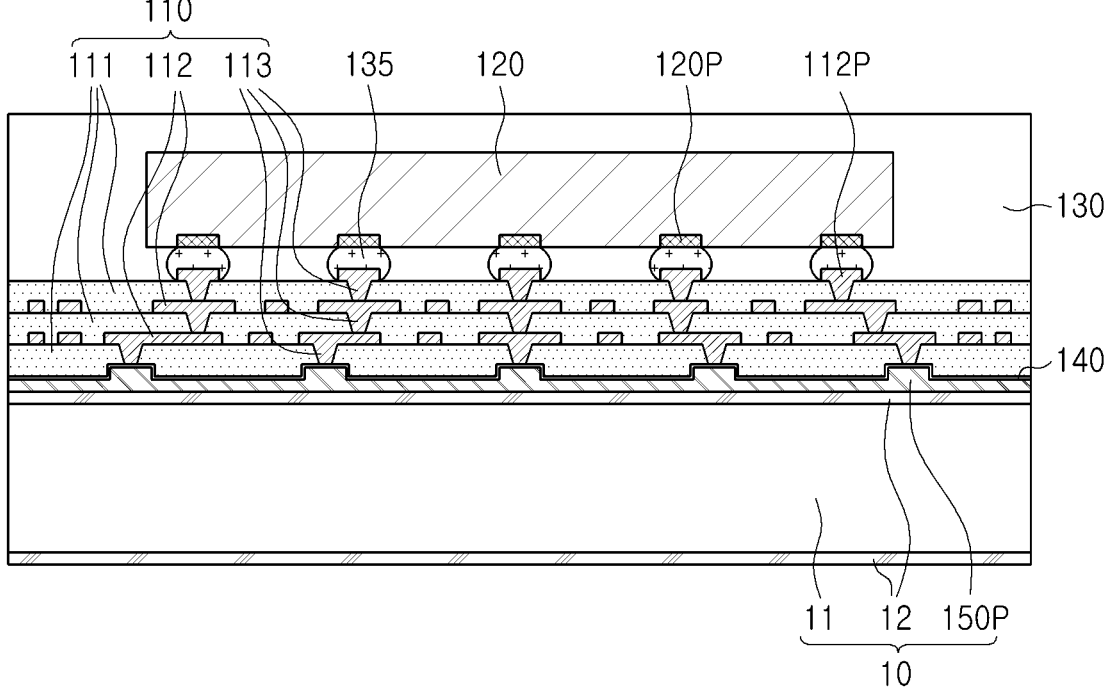

Referring to FIG. 11H, the encapsulation layer 130 molding the semiconductor chip 120 may be formed.

The encapsulation layer 130 may be formed to cover the semiconductor chip 120 and to cover the upper surface of the redistribution portion 110. The encapsulation layer 130 may be formed by laminating a sealing material (e.g., in a film form) and/or by applying and curing a sealing material in a liquid form. The encapsulation layer 130 may include an insulating material, for example, EMC.

Figure 11I:
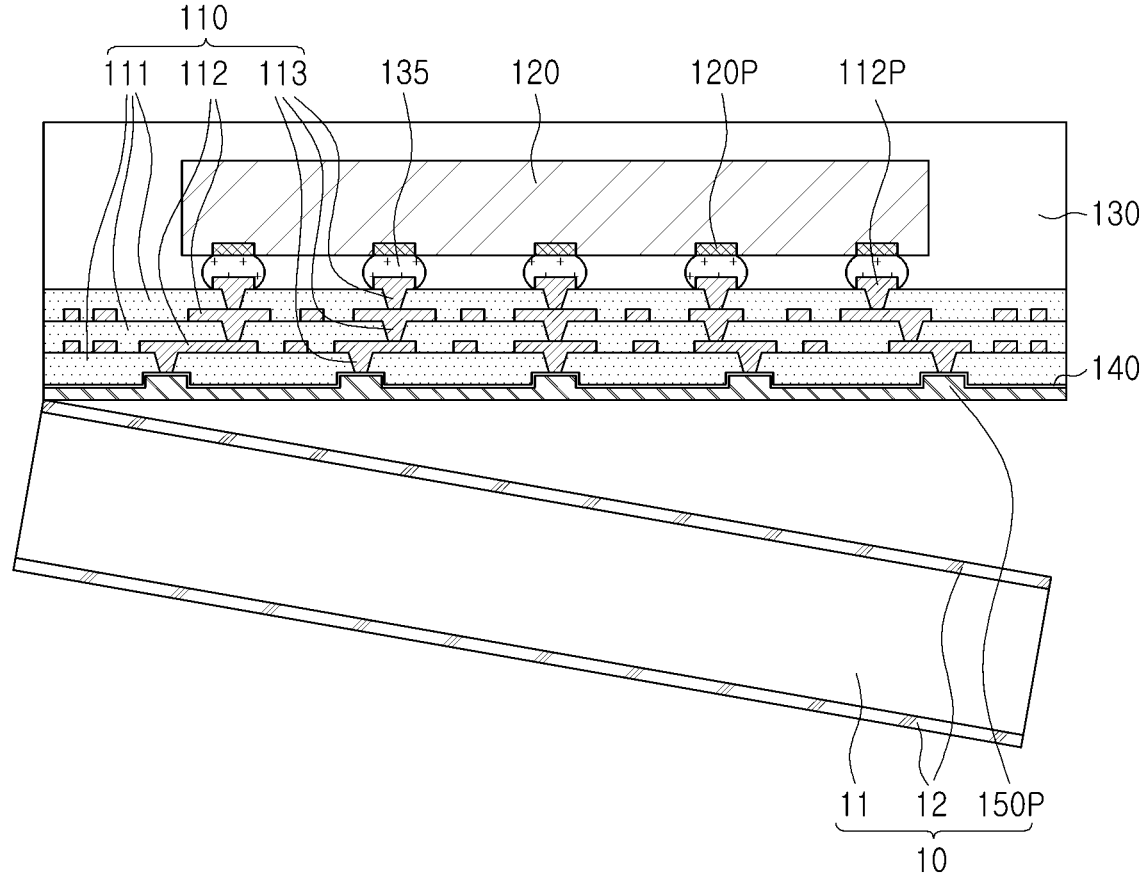

Referring to FIG. 11I, a portion of the carrier substrate 10 may be removed below the redistribution portion 110.

The core layer 11 and the first metal foil layers 12 of the carrier substrate 10 may be removed, and the second metal foil layer 150P may remain. The core layer 11 and the first metal foil layers 12 may be detached by, for example, separation of the organic release layer below the second metal foil layer 150P. In this operation, the second metal foil layer 150P is not removed and may remain stably attached by the adhesive layer 140.

Figure 11J:
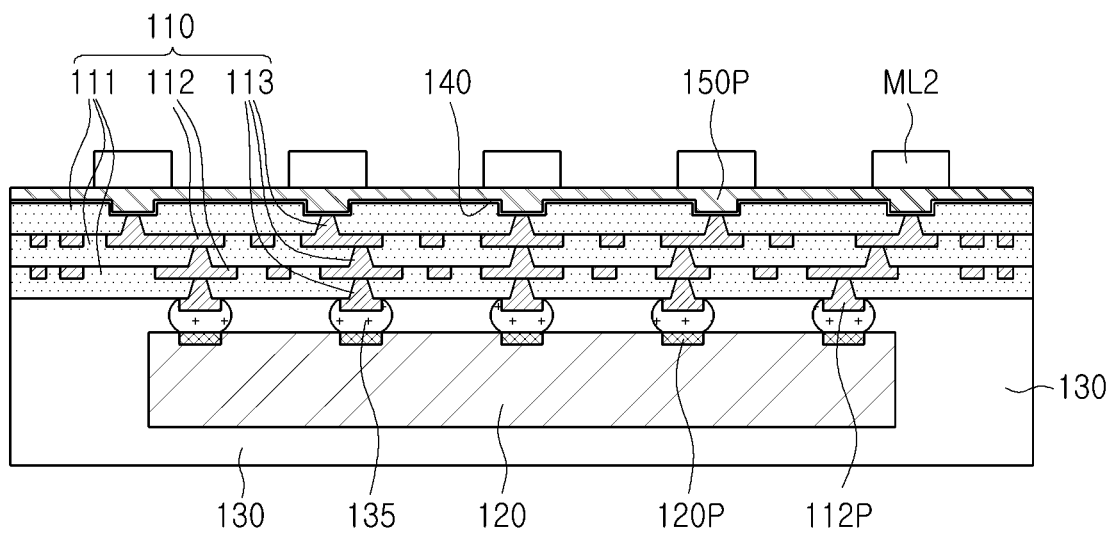

Referring to FIG. 11J, after the structure including the redistribution portion 110 and the semiconductor chip 120 is inverted such that the second metal foil layer 150P is positioned on the upper portion, a second mask layer ML2 may be formed on the second metal foil layer 150P.

In some embodiments, after a separate carrier is further attached onto the encapsulation layer 130, the second mask layer ML2 may be formed. The second mask layer ML2 may be patterned and formed by, for example, a photolithography process. The second mask layer ML2 may be formed to cover the second metal foil layer 150P in a region in which the UBM pads 152 (refer to FIG. 1) are to be formed. Accordingly, the region in which the second mask layer ML2 is formed may vertically overlap the region in which the first mask layer ML1 is formed in FIG. 11A, and may include the region in which the first mask layer ML1 is formed. The second mask layer ML2 may include, for example, DFR.

Figure 11K:
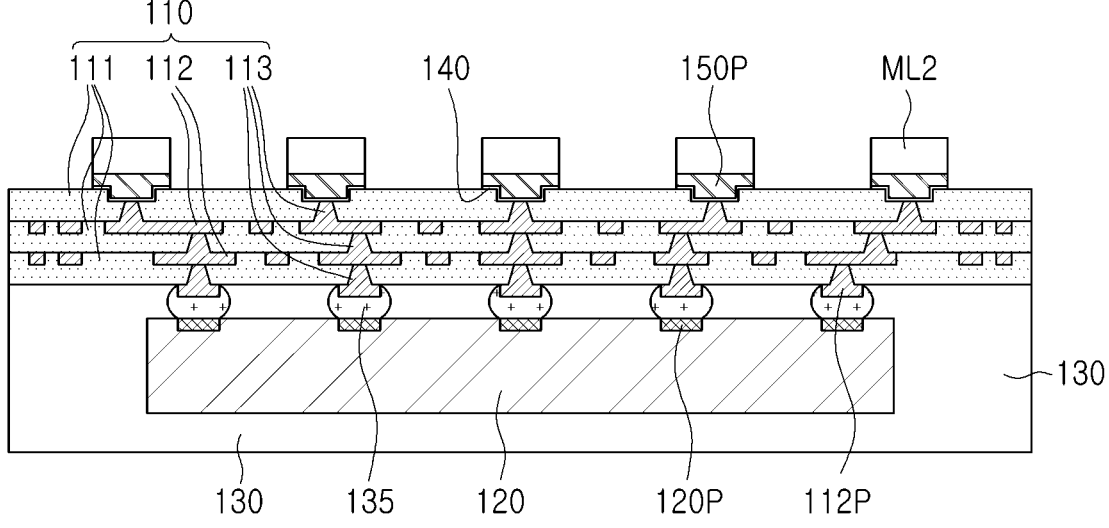

Referring to FIG. 11K, an upper portion of the second metal foil layer 150P may be patterned using the second mask layer ML2.

The second metal foil layer 150P may be removed by performing an etching process using the second mask layer ML2, to expose the insulating layer 111 provided therebelow. The second metal foil layer 150P may be removed by a thickness remaining on the insulating layer 111, and the thickness may correspond to the thickness of the UBM pads 152 (refer to FIG. 1). In this operation, regions forming the UBM pads 152 may be formed. In this operation, when portions of the second metal foil layer 150P is removed, the exposed adhesive layer 140 therebelow may also be removed.

Next, referring to FIG. 2 together, the second mask layer ML2 may be removed, and connection bumps 160 may be formed.

The finally remaining second metal foil layer 150P may form the UBM layer 150. The connection bumps 160 may be formed, for example, by attaching conductive balls constituting the connection bumps 160 and performing a reflow process.

According to the present example embodiments, by forming the UBM layer 150 using the second metal foil layer 150P of the carrier substrate 10, the manufacturing process may be simplified compared to the case of using a separate plating process. Since the UBM layer 150 is formed by patterning the second metal foil layer 150P by two etching processes from the upper and lower surfaces, implementing a form in which the UBM pad 152 protrudes downwardly of the redistribution portion 110 may be facilitated. Accordingly, as described above with reference to FIGS. 1 and 2, a crack propagation path at the interface with the connection bump 160 may be extended.

FIGS. 12A to 12E are main step-by-step views schematically illustrating a method of manufacturing a semiconductor package according to some example embodiments. FIGS. 12A to 12E illustrate an example embodiment of a method of manufacturing the semiconductor package of FIGS. 8 and 9.

Figure 12A:
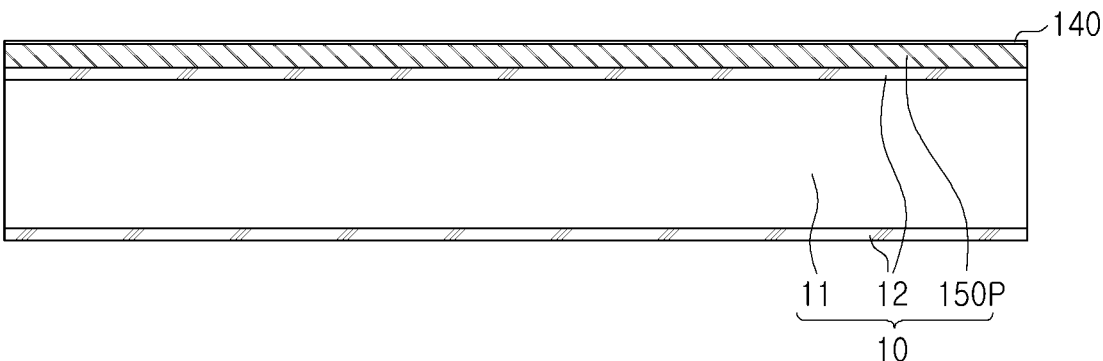
FIGS. 12A to 12E are main step-by-step views schematically illustrating a method of manufacturing a semiconductor package according to some example embodiments.

Referring to FIG. 12A, the adhesive layer 140 may be formed on the carrier substrate 10.

For the carrier substrate 10, the description described above with reference to FIG. 11A may be equally applied. The adhesive layer 140 may be formed on a flat upper surface of the second metal foil layer 150P by, for example, a sputtering process. The adhesive layer 140 may include a metal material, for example, titanium (Ti).

Figure 12B:
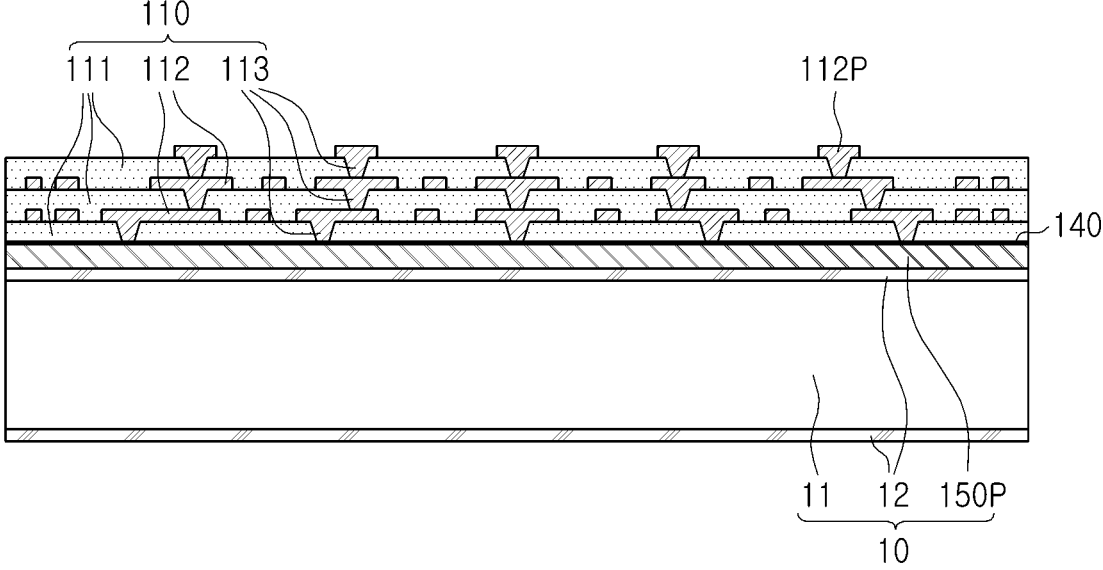

Referring to FIG. 12B, the redistribution portion 110 may be formed on the adhesive layer 140.

The redistribution portion 110 may be formed by performing the same process as described above with reference to FIGS. 11D to 11F.

Figure 12C:
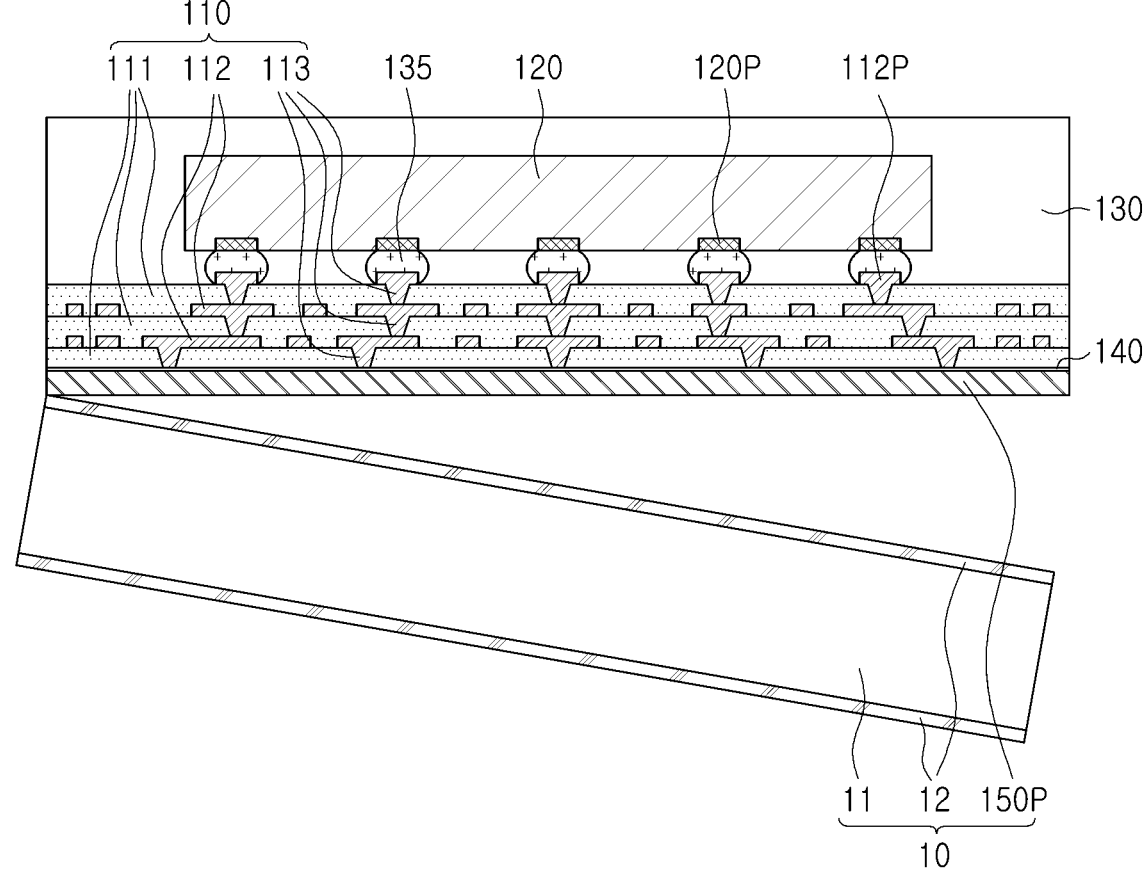

Referring to FIG. 12C, after the semiconductor chip 120 is mounted on the redistribution portion 110 and the encapsulation layer 130 is formed, a portion of the carrier substrate 10 may be removed below the redistribution portion 110.

The semiconductor chip 120 may be mounted and the encapsulation layer 130 may be formed by performing the same process as described above with reference to FIGS. 11G and 11H. In the case of the carrier substrate 10, as described above with reference to FIG. 11I, the core layer 11 and the first metal foil layers 12 are removed, and only the second metal foil layer 150P may remain.

Figure 12D:
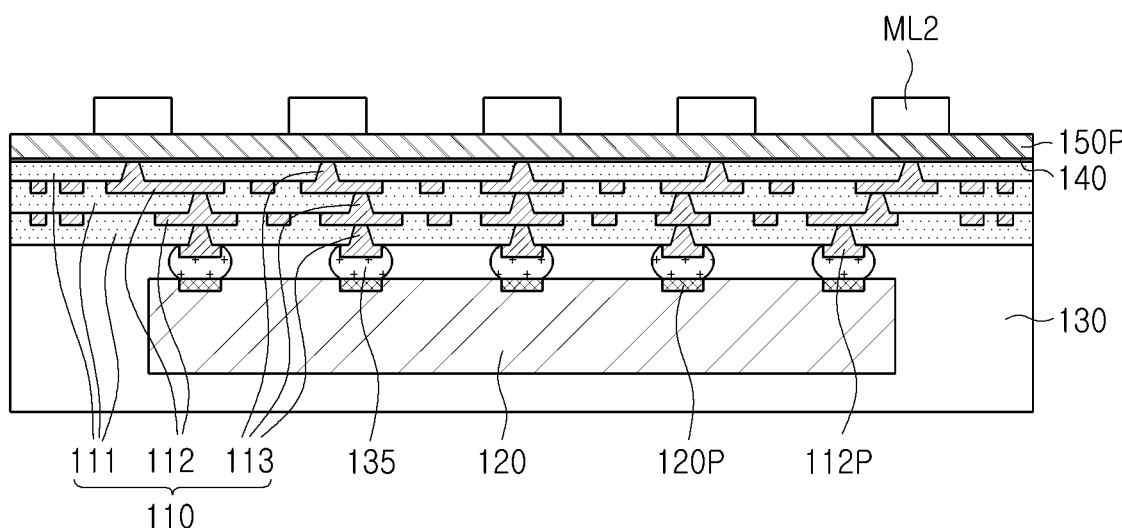

Referring to FIG. 12D, after inverting the structure including the redistribution portion 110 and the semiconductor chip 120 such that the second metal foil layer 150P is positioned on the upper portion, the second mask layer ML2 may be formed on the second metal foil layer 150P.

The second mask layer ML2 may be formed to cover the second metal foil layer 150P in a region in which the UBM layer 150i (refer to FIG. 8) is to be formed.

Figure 12E:
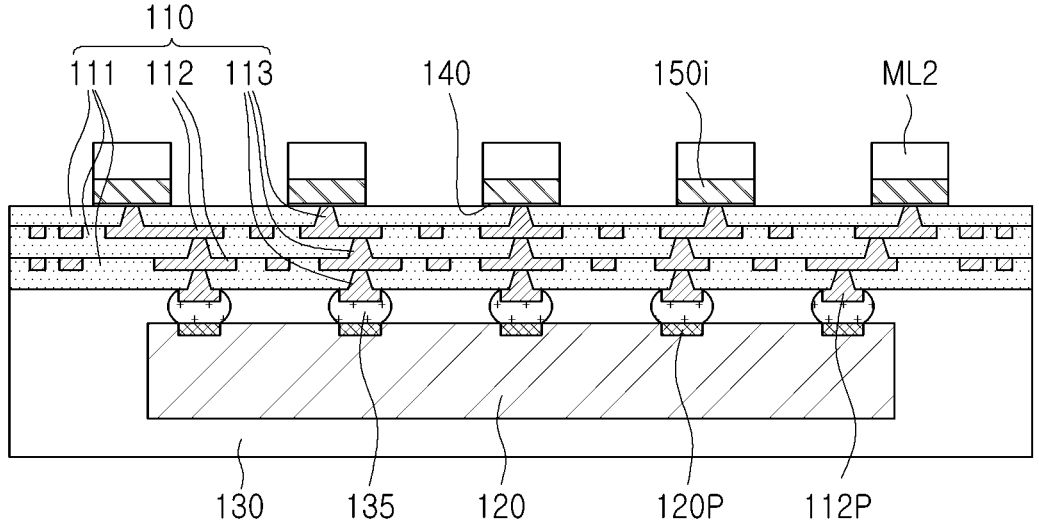

Referring to FIG. 12E, the second metal foil layer 150P may be patterned using the second mask layer ML2.

An etching process may be performed using the second mask layer ML2 as a mask to remove the second metal foil layer 150P to expose the insulating layer 111 provided therebelow. In this operation, the patterning may be performed on the entire thickness of the second metal foil layer 150P, and when the second metal foil layer 150P is removed, the exposed adhesive layer 140 therebelow may also be removed.

Next, referring to FIG. 8 together, the second mask layer ML2 may be removed, and connection bumps 160 may be formed. The portions of the second metal foil layer 150P that remain may form the UBM layer 150i (refer to FIG. 8).

As set forth above, by including a UBM layer formed using a copper foil of a carrier substrate, a semiconductor package having improved reliability and mass productivity and a method of manufacturing the same may be provided.

While some example embodiments have been illustrated and described above, it will be apparent to those skilled in the art that modifications and variations could be made without departing from the scope of the present inventive concepts as defined by the appended claims.

What is claimed is:

1. A semiconductor package comprising:
a redistribution portion including an insulating layer, a redistribution layer on the insulating layer, and a redistribution via connected to the redistribution layer;
an under-bump metallurgy (UBM) layer, the UBM layer including a UBM pad on a lower surface of the redistribution portion and a UBM via on the UBM pad, the UBM via penetrating the insulating layer;
a semiconductor chip on an upper surface of the redistribution portion and electrically connected to the redistribution layer, the upper surface of the redistribution portion being opposite to the lower surface of the redistribution portion;
an adhesive layer between the UBM layer and the insulating layer, the adhesive layer including a conductive material; and
a connection bump below the UBM pad and connected to the UBM layer,
wherein:
the UBM pad has a first diameter, and the UBM via has a second diameter less than the first diameter,
an upper surface of the UBM pad is at a same level as, or at a level lower than, a lower surface of the insulating layer,
the redistribution via is between the redistribution layer and the UBM layer,
the UBM via has an upper surface and a lower surface opposite to the upper surface of the UBM via,
the UBM via is between the UBM pad and the redistribution via such that the upper surface of the UBM via faces a lower surface of the redistribution via,
the UBM pad has an upper surface and a lower surface opposite to the upper surface of the UBM pad, the upper surface of the UBM pad facing the lower surface of the UBM via,
a sidewall of the redistribution via has a first taper such that a width of the redistribution via increases with distance away from the lower surface of the redistribution via and towards the redistribution layer,
a sidewall of the UBM via has a second taper such that a width of the UBM via increases with distance away from the upper surface of the UBM via and towards the UBM pad, and
a sidewall of the UBM pad has a third taper such that a width of the UBM pad increases with distance away from the lower surface of the UBM pad and towards the UBM via.

2. The semiconductor package of claim 1, wherein the UBM via is buried in the insulating layer and protrudes downwardly from the lower surface of the insulating layer by a thickness of the adhesive layer.

3. The semiconductor package of claim 1, wherein the sidewall of the UBM pad and the sidewall of the UBM via have different inclinations.

4. The semiconductor package of claim 3, wherein, when viewed in cross-section,
a width of an upper end of the UBM pad is greater than a width of a lower end of the UBM pad.

5. The semiconductor package of claim 1, wherein a crystal structure of the UBM pad and the UBM via is different from a crystal structure of the redistribution layer and the redistribution via.

6. The semiconductor package of claim 5, wherein:
the crystal structure of the UBM pad and the UBM via has a pancaked grain structure, and the crystal structure of the redistribution layer and the redistribution via has a columnar grain structure.

7. The semiconductor package of claim 1, wherein a thickness of the UBM pad is in a range of about 2 μm to about 12 μm.

8. The semiconductor package of claim 1, wherein the UBM pad and the UBM via are an integrated body.

9. The semiconductor package of claim 1, wherein the adhesive layer extends along the upper surface of the UBM pad, the sidewall of the UBM via, and the upper surface of the UBM via.

10. The semiconductor package of claim 1, wherein the conductive material of the adhesive layer includes a material different from a material of the UBM via and a material of the redistribution via.

11. The semiconductor package of claim 1, wherein the connection bump covers the lower surface and at least a portion of the sidewall of the UBM pad.

12. The semiconductor package of claim 1, wherein the redistribution layer and the redistribution via include a plating seed layer, the plating seed layer extending along a lower surface of the redistribution layer, the sidewall of the redistribution via, and the lower surface of the redistribution via.

13. The semiconductor package of claim 1, wherein a portion of the redistribution portion does not overlap the semiconductor chip when viewed in a plan view.

14. A semiconductor package comprising:
a redistribution portion including an insulating layer, a redistribution layer on the insulating layer, a redistribution via connected to the redistribution layer, and a seed layer between the insulating layer and the redistribution layer and covering a side surface and a lower surface of the redistribution via such that the seed layer is between the insulating layer and the redistribution via;
an under-bump metallurgy (UBM) layer below a lower surface of the redistribution portion and electrically connected to the redistribution layer through the redistribution via;
a semiconductor chip on an upper surface of the redistribution portion and electrically connected to the redistribution layer;
an adhesive layer on the lower surface of the redistribution portion and between the redistribution portion and the UBM layer; and
a connection bump below the UBM layer and connected to the UBM layer,
wherein:
a crystal structure of the UBM layer and a crystal structure of the redistribution layer are different, and
a portion of the adhesive layer on an uppermost surface of the UBM layer is in contact with the insulating layer.

15. The semiconductor package of claim 14, wherein:
the crystal structure of the UBM layer has a pancaked grain structure, and
the crystal structure of the redistribution layer and a crystal structure of the redistribution via have a columnar grain structure.

16. The semiconductor package of claim 14, wherein, in the UBM layer, an upper end has a first diameter and a lower end has a second diameter less than the first diameter.

17. The semiconductor package of claim 14, wherein an entirety of the UBM layer is on the lower surface of the redistribution portion.

18. The semiconductor package of claim 14, wherein:
the UBM layer includes a UBM pad on the lower surface of the redistribution portion, and a UBM via in the insulating layer and on the UBM pad, and
when viewed in cross-section, a diameter of the UBM pad increases upwardly, and a diameter of the UBM via decreases upwardly.

19. A semiconductor package comprising:
a redistribution portion including an insulating layer and a redistribution structure on the insulating layer, the redistribution structure including a redistribution via;
an under-bump metallurgy (UBM) layer below the redistribution portion, the UBM layer including
a UBM pad below a lower surface of the redistribution portion and
a UBM via in the insulating layer, on the UBM pad, and connecting the redistribution structure and the UBM pad;
a semiconductor chip on an upper surface of the redistribution portion and electrically connected to the redistribution structure, the upper surface of the redistribution portion being opposite to the lower surface of the redistribution portion; and
a connection bump below the UBM pad and connected to the UBM pad,
wherein:
the UBM via has an upper surface and a lower surface opposite to the upper surface of the UBM via,
the UBM via is between the UBM pad and the redistribution via such that the upper surface of the UBM via faces a lower surface of the redistribution via,
the UBM pad has an upper surface and a lower surface opposite to the upper surface of the UBM pad, the upper surface of the UBM pad facing the lower surface of the UBM via,
when viewed in cross-section, the upper surface of the UBM pad has a first width as a distance between sidewalls of the UBM pad, the lower surface of the UBM pad has a second width as the distance between the sidewalls of the UBM pad, and the second width is less than the first width,
when viewed in the cross-section, the upper surface of the UBM via has a third width as a distance between sidewalls of the UBM via, the lower surface of the UBM via has a fourth width as the distance between the sidewalls of the UBM via, and the fourth width is greater than the third width,
when viewed in the cross-section, an upper surface of the redistribution via has a fifth width as a distance between sidewalls of the redistribution via, the lower surface of the redistribution via has a sixth width as the distance between the sidewalls of the redistribution via, and the sixth width is less than the fifth width, and
the sixth width is less than the third width.

20. The semiconductor package of claim 19, wherein the first width is greater than the fourth width.

* * * * *